(12) United States Patent
Kawaguchi et al.

(10) Patent No.: US 7,342,349 B2
(45) Date of Patent: Mar. 11, 2008

(54) PIEZOELECTRIC ACTUATOR ARRAY AND MANUFACTURING METHOD

(75) Inventors: Tatsuo Kawaguchi, Mizuho (JP); Koji Kimura, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 708 days.

(21) Appl. No.: 10/635,408

(22) Filed: Aug. 6, 2003

(65) Prior Publication Data

US 2004/0027034 A1 Feb. 12, 2004

(30) Foreign Application Priority Data

Aug. 7, 2002 (JP) ............................ 2002-230101
Dec. 6, 2002 (JP) ............................ 2002-355633
Jun. 18, 2003 (JP) ............................ 2003-174077

(51) Int. Cl.
*H01L 41/08* (2006.01)

(52) U.S. Cl. ...................................... 310/334

(58) Field of Classification Search ................ 310/348, 310/328, 311, 366, 364, 334; H01L 41/08
See application file for complete search history.

(56) References Cited

U.S. PATENT DOCUMENTS 6,584,660 B1 * 7/2003 Shimogawa et al. ........ 310/328
6,794,723 B2 * 9/2004 Takeuchi et al. ............ 257/415

FOREIGN PATENT DOCUMENTS

JP 3058143 8/1999

* cited by examiner

*Primary Examiner*—Darren Schuberg
*Assistant Examiner*—Karen Addison
(74) *Attorney, Agent, or Firm*—Burr & Brown

(57) ABSTRACT

There is disclosed a one-dimensional piezoelectric actuator array 1 houses a piezoelectric device 35 including a plate or pillar-shaped piezoelectric member 4 and electrodes 18, 19, and having a planar form; the device 35 being driven by a piezoelectric effect of the piezoelectric member 4. The piezoelectric device 35 is formed as a whole in a planar comb shape wherein comb teeth 26 are connected to one another in one end, and portions of the comb teeth 26 work as a plurality of driving portions 31. The guide substrate 2 and piezoelectric device substrate 3 are integrally unified in such a manner that the resultant is readily usable for the formation of a multiply stuck structural body. In case of need, the array may be further provided with a guide substrate 2 having a concave portion 9 for housing at least a part of the piezoelectric device substrate 3.

12 Claims, 18 Drawing Sheets

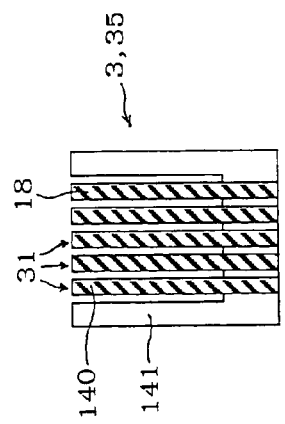
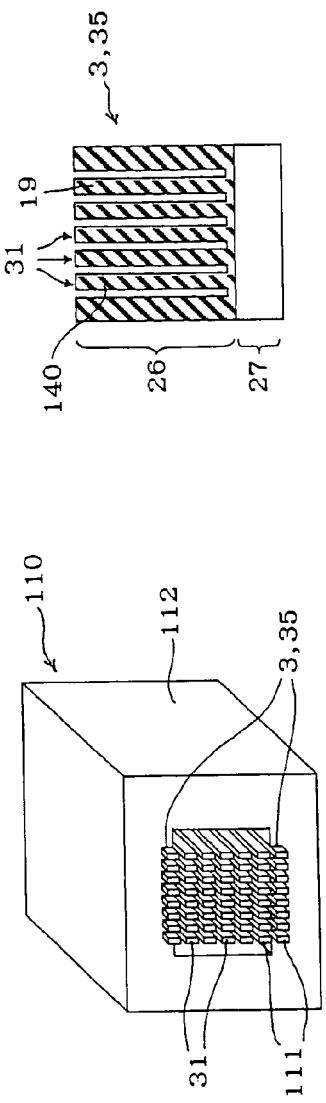
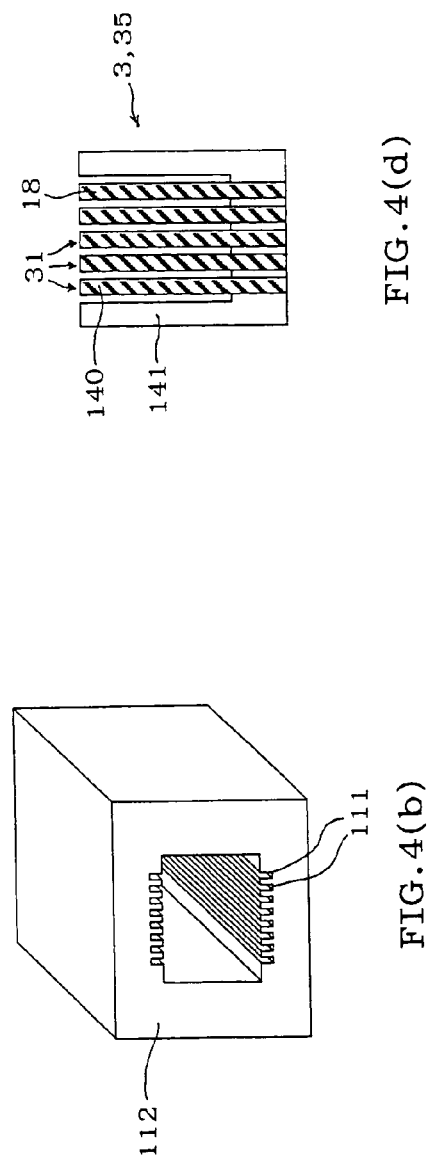
FIG. 4(a)
FIG. 4(b)
FIG. 4(c)
FIG. 4(d)

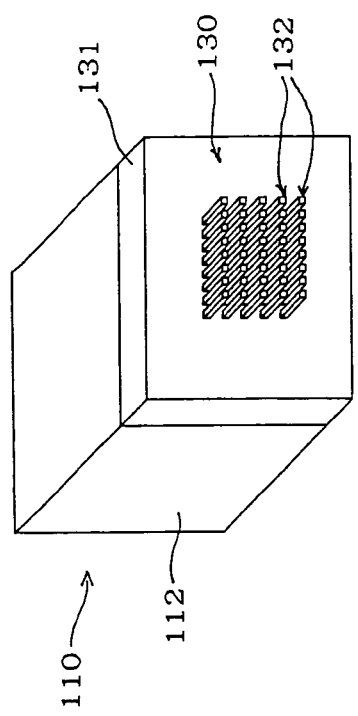
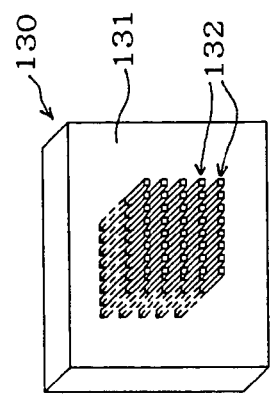
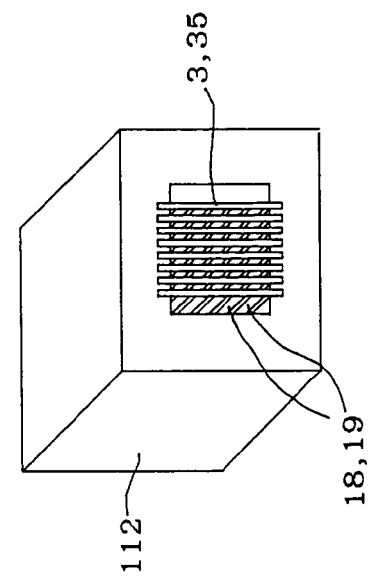
FIG.6(a)
FIG.6(b)
FIG.6(c)

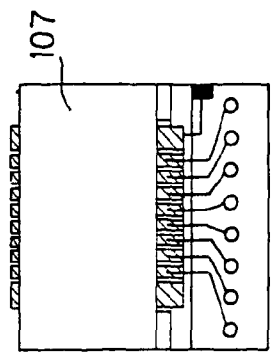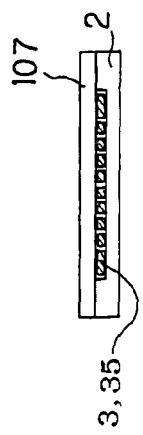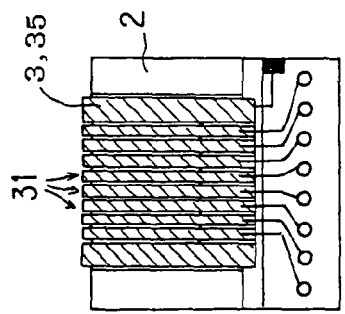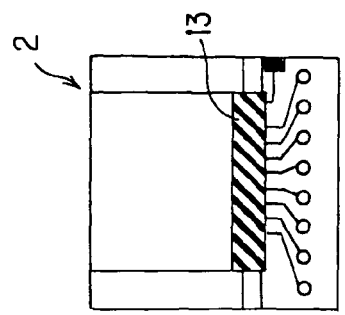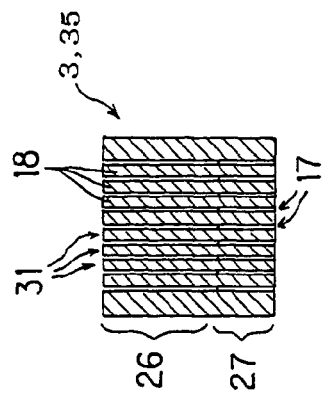

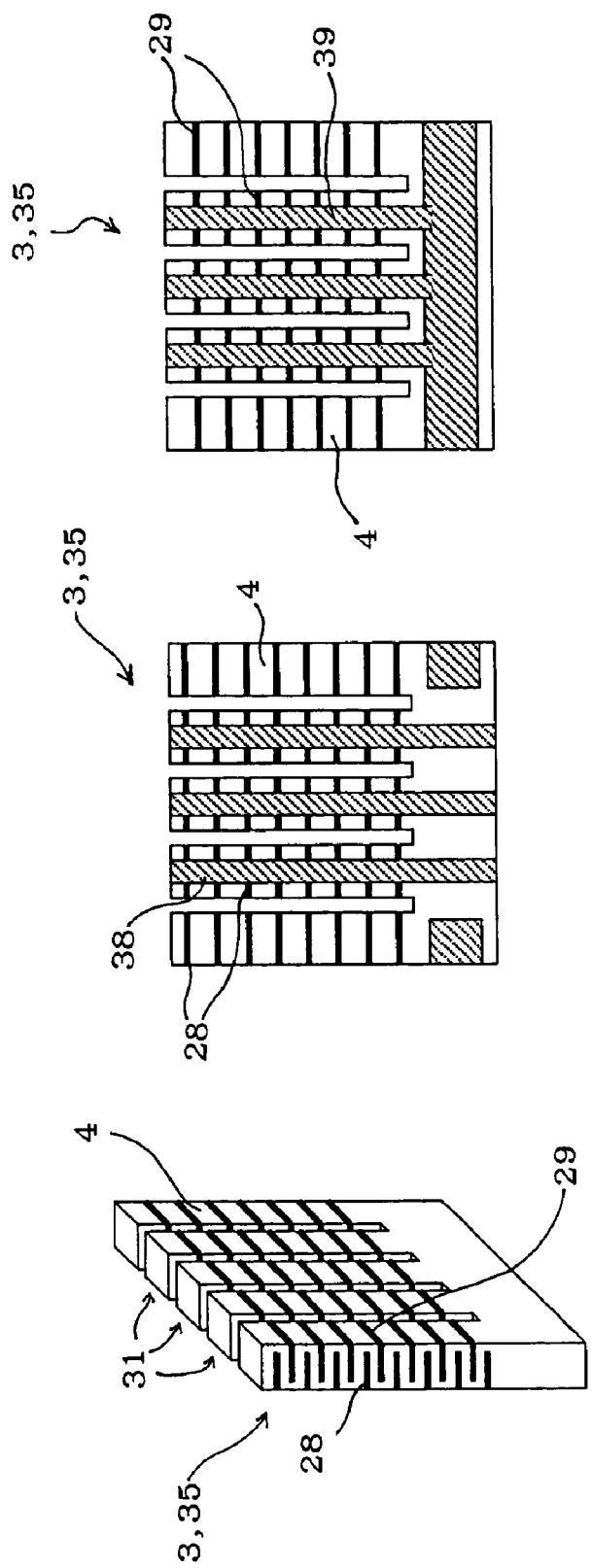

PIEZOELECTRIC ACTUATOR ARRAY AND MANUFACTURING METHOD

BACKGROUND OF THE INVENTION

1. Field of the Invention

The present invention relates to an actuator array which causes displacement based on an electric/mechanic energy conversion using an electric field induced strain such as an inverse piezoelectric effect. In more detail, the present invention relates to a piezoelectric actuator array which is preferably used in an optical switch, optical shutter, optical micro-device such as a mirror array, image display apparatus, high frequency filter, micro-pump, droplet discharge apparatus, and the like and which achieves both a high generation force and large displacement and in which a piezoelectric member causing the displacement has a high aspect ratio superior in consistency of the generation force and displacement and which is easily handled and positioned, and also relates to a manufacturing method of the actuator array.

2. Description of the Related Art

In recent years, in an optical field, precision machine field, semiconductor manufacturing field, and the like, there has been a demand for a displacement control device which adjusts an optical path length or position in an order of sub-microns. To meet this demand, development of an actuator has been advanced in which a strain is used based on an inverse piezoelectric effect or electrostrictive effect caused at a time of application of an electric field onto a ferroelectric or antiferroelectric material. As compared with a conventional electromagnetic system by a servo motor, the displacement control device using these electric field induced strains has characteristics that micro displacement is easily controlled, an electric/mechanic energy conversion efficiency is high to save power, and the device can be mounted with an ultra precision and can contribute to the miniaturizing/lightening of products. Applied fields are assumed to be enlarged.

For example, in the optical switch, the use of a piezoelectric actuator as an actuator portion for switching a transmission path of input light has been proposed. One example of the optical switch is shown in FIGS. 20(a), 20(b). An optical switch 200 shown in FIGS. 20(a), 20(b) includes a light transmission portion 201, optical path-changing portion 208, and actuator section 211. In detail, the light transmission portion 201 includes a light reflection surface 101 disposed partially in a surface disposed opposite to the optical path-changing portion 208, and light transmission channels 202, 204, 205 disposed in three directions from the light reflection surface 101 which is a start point. The optical path-changing portion 208 is disposed in the vicinity of the light reflection surface 101 of the light transmission portion 201 in a movable state, and includes a light introduction member 209 formed of a translucent material, and a light reflection member 210 which totally reflects light. Furthermore, the actuator section 211 includes a mechanism which is displaced by an external signal and which transmits the displacement to the optical path-changing portion 208.

In the optical switch 200, as shown in FIG. 20(a), the actuator section 211 operates by an external signal indicating the application of a voltage, and the optical path-changing portion 208 is detached from the light transmission portion 201 by the displacement of the actuator section 211. A light 221 inputted in the light transmission channel 202 of the light transmission portion 201 does not pass and is totally reflected by the light reflection surface 101 of the light transmission portion 201 whose refractive index is adjusted to a predetermined value, and is transmitted to the light transmission channel 204 on the output side.

On the other hand, conversely, the actuator section 211 is brought into an inoperative state from this state. Then, as shown in FIG. 20(b), the displacement of the actuator section 211 returns to an original state, and the light introduction member 209 of the optical path-changing portion 208 contacts the light transmission portion 201 at a distance which is not more than a wavelength of the light. Therefore, the light 221 inputted into the light transmission channel 202 is taken out into the light introduction member 209 from the light transmission portion 201 by the light introduction member 209, and passes through the light introduction member 209. The light 221 transmitted through the light introduction member 209 reaches the light reflection member 210. However, the light reflected by the a reflective surface 102 of the light reflection member 210 is transmitted to the other light transmission channel 205 on an output side, different from the light reflected by the light reflection surface 101 of the light transmission portion 201.

In the above-described optical switch, in order to enhance a performance, first, there is a demand for a large ON/OFF ratio (contrast). In order to set the ON/OFF ratio (contrast) to be large, in the optical switch 200, it is important to securely perform a contact/release operation with respect to the light transmission portion 201 of the optical path-changing portion 208. The actuator section preferably takes a large stroke, that is, is largely displaced.

To further enhance the performance, there is a demand for reduction of a loss in the switching. In this case, it is important to increase a substantial contact area with respect to the light transmission portion 201 while increasing the area of the optical path-changing portion 208. Moreover, the increase of the contact area is a factor for drop of certainty in the releasing, and therefore the actuator section needs to be capable of generating a large force.

That is, for the enhancement of the performance of the optical switch, as the actuator section, there has been a demand for a piezoelectric actuator in which the displacement can be consistent with the generation force. Additionally, in the optical switch, in future, with advancement in construction of an optical network system which does not perform optical/electric conversion, the number of channels of a photonic router increases, whereas the photonic router is requested to be further miniaturized. Therefore, there is a demand for high integration in the optical switch which is one constituting element of the photonic router.

However, in the piezoelectric actuator in which a plurality of piezoelectric devices of a uni-morph or bimorph type which has heretofore been known are arranged (these will hereinafter be referred to as the flexure displacement devices) a slight contraction strain of the piezoelectric device itself at the time of the electric field application is converted to a flexure mode to form the flexure displacement. Therefore, it is easy to obtain a large displacement in proportion to a device length of the piezoelectric device. However, since the strain is converted, a generated stress applied to the directly generated strain of the piezoelectric device cannot be used as such. It is very difficult to enlarge the generation force simultaneously with the displacement.

Moreover, in the flexure displacement device, a plate piezoelectric member is constituted/disposed substantially vertically to a displacement direction. Therefore, a device dimension (width or thickness) naturally and inevitably increases, and it is therefore difficult to dispose the device in a high density while reducing the pitch.

The actuator in which the piezoelectric devices are arranged in the high density has heretofore been proposed (e.g., see Japanese Patent No. 3058143 specification, especially FIG. 1 thereof; hereinafter referred to as Patent Document 1). The piezoelectric actuator in Patent Document 1 is optimum for an ink jet system recording apparatus, and is disclosed as a piezoelectric actuator in which pillar-shaped piezoelectric devices functioning as a driving organization are arranged in a grid pattern in a planar form and can be arranged in high integration. Moreover, the piezoelectric actuator is reported to have an effect that the number of ink jet nozzles per unit area in the recording apparatus of the ink jet system can be increased.

However, for the disclosed piezoelectric actuator, green sheets coated beforehand with common or application electrodes are stuck and sintered, and thereafter grooves are processed by a dicing saw in order to independently separate the pillar-shaped piezoelectric devices from one another. Therefore, there are at least two problems as follows.

First, the electrode includes a structure housed beforehand in the piezoelectric device, and is therefore influenced by the strain at a sintering time. A layer structure including the electrode-piezoelectric member of each independently separated piezoelectric device easily becomes uneven, and there is a problem that fluctuations of characteristics are caused among the devices. Additionally, considering from the sintering strain, the device dimension (width or thickness) naturally and inevitably increases, and it is therefore difficult to reduce the pitch. According to a disclosed mode example, the piezoelectric device has a width of 0.3 mm, the groove has a width of 0.209 to 0.718 mm, and the density has a degree of one piezoelectric device disposed per about 1 mm². However, this cannot easily be said to be a sufficient integration for handing a resolution which has been required for an ink jet printer in recent years. The integration cannot be satisfactory even in the optical switch whose one mode example is shown in FIGS. 20(a), 20(b).

Next, in the disclosed piezoelectric actuator, the independently separated piezoelectric devices are formed by the dicing saw processing, but there is a problem that a depth of the groove, that is, a height of the piezoelectric device is inevitably reduced/limited by processing restrictions. For a lateral effect device in which the generated displacement depends on the height of the piezoelectric device, when the height is limited, the obtained displacement is not sufficient. That is, in the disclosed piezoelectric actuator, it is impossible to increase an aspect ratio (height/thickness) of the piezoelectric device (piezoelectric member) which is an index of high integration and high characteristic. Therefore, the actuator is not preferable not only for the ink jet printer but also for the actuator section of the optical switch.

SUMMARY OF THE INVENTION

As described above, there has been a demand for a piezoelectric actuator in which a generated displacement is consistent with a generation force and which can independently be disposed in a ultrahigh density, but the piezoelectric actuator has not heretofore been proposed. The present invention has been developed to meet this demand. That is, an object of the present invention is to provide a piezoelectric actuator which can obtain a large displacement with a lower voltage and whose generation force is large and which is superior in mounting properties and which can highly be integrated, and to provide a manufacturing method of the piezoelectric actuator. Further object is to apply the piezoelectric actuator in optical micro-devices such as an optical switch, optical shutter, and mirror array, an image display apparatus, a high-frequency filter, a micro-pump, a droplet discharge apparatus, and the like so that capabilities of these are enhanced.

As a result of repeated studies with respect to the piezoelectric actuator, it has been found that the above-described object can be achieved by the following piezoelectric actuator array.

According to the present invention, there are provided one-dimensional and two-dimensional piezoelectric actuator arrays, and manufacturing methods of the one-dimensional and two-dimensional piezoelectric actuator arrays.

First, there is provided a one-dimensional piezoelectric actuator array comprising: a piezoelectric device which comprises a plate or pillar-shaped piezoelectric member, and at least one pair of electrodes formed on the piezoelectric member; said piezoelectric device being driven based on a piezoelectric effect of the piezoelectric member and being disposed in a planar form, wherein the piezoelectric device constitutes a piezoelectric device substrate, it is formed in a planar comb shape as a whole in which comb teeth are connected to one another in one end, and comb-teeth portions thus formed are functioned as a plurality of driving portions to, wherein a guide substrate having a concave portion for housing at least a part of the piezoelectric device substrate in a predetermined position in a unified form is further disposed in addition to the piezoelectric device substrate, and the guide substrate and the piezoelectric device substrate are integrally unified in such a manner that the resultant is easily stuck in a multiply stuck structural body (hereinafter sometimes referred to as an arrayed piezoelectric actuator).

In the one-dimensional piezoelectric actuator array according to the present invention, the guide substrate includes projections and/or ridges arranged at an interval corresponding to a width of the driving portion in a bottom surface of the concave portion, each of the projections and/or ridges are inserted between each pair of a plurality of driving portions, thereby the guide substrate and the piezoelectric device substrate are preferably integrally unified.

Moreover, to apply a voltage to the piezoelectric member, a wiring circuit connected to a pair of electrodes may also be disposed in a substrate (component) separate from the guide substrate, but is preferably disposed in the guide substrate. Since this structure further becomes simple and is easily prepared, cost can be reduced, and yield can be enhanced.

In the piezoelectric device piezoelectric actuator according to the present invention, straightness of an axial line of the driving portion extending substantially in parallel with a displacement direction is preferably about 30 μm or less. It is to be noted that in the present invention the piezoelectric device substrate has a comb shape as a whole, but the shapes of individual comb-teeth portions (driving portions) do not have to be uniform, and comb teeth having different shapes may also be combined to form the comb shape in accordance with applications.

Moreover, for the driving portion of the piezoelectric device, a ratio of a length in the displacement direction to a shortest distance passing through an axial line in a section substantially vertical to the displacement direction, that is, an aspect ratio is preferably substantially 10:1 to 1000:1. When the aspect ratio is smaller than 10:1, the guide substrate does not have to be used in some case, because the piezoelectric device substrate (one-dimensional structure) can easily be positioned. On the other hand, when the aspect ratio is larger than 1000:1, the strength of the piezoelectric device itself constituting the piezoelectric device substrate drops, and it is sometimes difficult to maintain the strength even with the use of the guide substrate.

Furthermore, it is possible to arrange the driving portions in a high density such that a ratio of the length of the driving portion in the displacement direction to an interval between the driving portions disposed adjacent to each other is substantially 10:1 to 1000:1. It is to be noted that the interval (pitch) between the adjacent driving portions may be either even or uneven (scattered).

Moreover, according to the present invention, there is provided a two-dimensional piezoelectric actuator array in which a plurality of one-dimensional piezoelectric actuator arrays described above are multiply stuck to form a multiply stuck structural body, and the plurality of driving portions are structurally aligned/arranged.

Especially in the two-dimensional piezoelectric actuator array, when the driving portions of the piezoelectric device are arranged in higher integration, flatness of the guide substrate is important. The flatness of the guide substrate is preferably 1/5 or less of the thickness of the guide substrate, and further preferably 1/10 or less. The thinner guide substrate is preferable, and the strength higher than that of the piezoelectric member is preferable. It is to be noted that in the present invention the piezoelectric device substrate as a whole has the comb shape, but the shapes of the individual piezoelectric device substrates do not have to be the same comb shape, and a plurality of piezoelectric device substrates having different comb shapes may also be used. For example, the lengths of the comb teeth may differ with each combined piezoelectric device substrate.

Moreover, according to the present invention, there is provided a two-dimensional piezoelectric actuator array comprising: a structurally aligned/arranged plural number of piezoelectric devices each of which comprises a plate or pillar-shaped piezoelectric member, and at least one pair of electrodes formed on the piezoelectric member; said constitute a piezoelectric device substrate being driven based on a piezoelectric effect of the piezoelectric member and being disposed in a planar form, wherein the piezoelectric device constitutes a piezoelectric device substrate, it is formed in a planar comb shape as a whole, and comb teeth are connected to one another in one end, comb-teeth portions thus formed are functioned as a plurality of driving portions, wherein, in addition to the piezoelectric device substrate, a first guide frame member is disposed: said first guide frame member being of a hollow box shape and having a plurality of pairs of guide grooves for housing at least a part of a plurality of piezoelectric device substrates in two inner surfaces facing each other of the guide frame member in accordance with a number of piezoelectric device substrates to be housed in an aligned state in a predetermined position at a predetermined interval, and said guide frame member being arranged at an interval corresponding to a thickness of the piezoelectric device substrate, and wherein the plurality of piezoelectric device substrates are inserted and housed in the corresponding guide grooves of the first guide frame member and the plurality of driving portions are aligned/arranged in the structural manner.

The two-dimensional piezoelectric actuator array according to the present invention further comprises: a lid member in which slits are formed at an interval same as an interval between guide grooves positioned adjacently each other; said slits having a shape corresponding substantially to that of tip ends of the plurality of driving, wherein the tip ends of the plurality of driving portions are preferably inserted into the slits to be fixed at predetermined positions, respectively.

Moreover, wiring components including structures aligned/arranged in the same spatial manner as that of the plurality of driving portions are preferably connected to the respective electrodes. The straightness of the axial line of the driving portion extending substantially in parallel with the displacement direction is preferably about 30 μm or less.

For the driving portion in the two-dimensional piezoelectric actuator array according to the present invention, the ratio of the length in the displacement direction to the shortest distance passing through the axial line in the section substantially vertical to the displacement direction, that is, the aspect ratio is preferably substantially 10:1 to 1000:1. When the aspect ratio is smaller than 10:1, the first guide frame member does not have to be used in some case, because the two-dimensional structure can easily be positioned. On the other hand, when the aspect ratio is larger than 1000:1, the strength of the piezoelectric device itself constituting the piezoelectric device substrate drops, and it is sometimes difficult to maintain the strength even with the use of the first guide frame member.

The ratio of the length of the driving portion in the displacement direction to the interval between the driving portions disposed adjacent to each other in the same piezoelectric device substrate, or to the interval between the driving portions disposed adjacent to each other in different piezoelectric device substrates is preferably substantially 10:1 to 1000:1. It is to be noted that the interval (pitch) between the adjacent driving portions may be either even or uneven (scattered).

Moreover, according to the present invention, there is provided a one-dimensional piezoelectric actuator array comprising: a plurality of piezoelectric devices each of which comprises a plate or pillar-shaped piezoelectric member, and at least one pair of electrodes formed on the piezoelectric member; said constitute a piezoelectric device substrate being driven based on a piezoelectric effect of the piezoelectric member and being disposed in a planar form, wherein a plurality of piezoelectric devices are arranged in the planar form in an independently separated state, in addition to the piezoelectric devices a guide substrate is further disposed a concave portion for housing at least a part of each of the plurality of piezoelectric devices is in a predetermined position in a unified form, and wherein the guide substrate and the plurality of piezoelectric devices are integrally unified in such a manner that the resultant is easily usable to stack it multiply to form a multiply stuck structural body.

Furthermore, according to the present invention, there is provided a two-dimensional piezoelectric actuator array comprising: a spatially aligned plurality of piezoelectric devices each of which comprises a plate or pillar-shaped piezoelectric member and at least one pair of electrodes formed on the piezoelectric member; said constitute a piezoelectric device substrate being driven based on a piezoelectric effect of the piezoelectric member and being disposed in a planar form, wherein, in addition to the piezoelectric devices, a second guide frame member is disposed and said second guide frame has a plurality of openings arranged in a grid form, and a housing space being channeled through to the plurality of openings and fixing the plurality of piezoelectric devices by housing it, wherein the respective piezoelectric devices are fixed by inserting the plurality of piezoelectric devices to the corresponding housing space of the second guide frame member, thereby the plurality of piezoelectric devices are spatially aligned/arranged.

It is to be noted that in the present specification, unless otherwise mentioned, the one-dimension or the two-dimension depends on whether the driving portions of the piezoelectric devices are arranged in the planar form, that is, on one plane, or in the structural manner or spatially. The former will be referred to as the one-dimensional piezoelectric actuator array and the latter will be referred to as the two-dimensional piezoelectric actuator array. Unless otherwise mentioned, the piezoelectric actuator array indicates both the one-dimensional and two-dimensional piezoelectric actuator arrays according to the present invention. The two-dimensional piezoelectric actuator array including the guide substrate will be referred to as the "two-dimensional piezoelectric actuator array (guide substrate type)", and the two-dimensional piezoelectric actuator array including the guide frame member will be referred to as the "two-dimensional piezoelectric actuator array (first guide frame member type) or "two-dimensional piezoelectric actuator array (second guide frame member type)".

The straightness and axial line described in the present specification are described in Japanese Industrial Standards B0621 "Definition and Display of Geometric Deviation". The straightness indicates the size of deviation of a linear member from a geometrically correct straight line. The axial line indicates a line which connects centers of sectional contour lines in transverse sections to each other of an object designated as if the linear member were cylindrical or rectangular parallelepiped. In the piezoelectric actuator array according to the present invention, the straightness of the axial line of the driving portion (piezoelectric member) of the piezoelectric device substantially having a substantially pillar shape or mostly having an elongated rectangular parallelepiped shape can be maintained to be remarkably small. This means that the driving portion (piezoelectric member) of the piezoelectric device of the piezoelectric actuator array according to the present invention has a shape remarkably close to the geometrically correct rectangular parallelepiped shape having no deformation such as warpage or bend even when the aspect ratio is large.

Next, a manufacturing method will be described. First, according to the present invention, there is provided a manufacturing method of a one-dimensional piezoelectric actuator array comprising a plate or pillar-shaped piezoelectric member and at least one pair of electrodes formed on the piezoelectric member; said constitute a piezoelectric device substrate being driven based on a piezoelectric effect of the piezoelectric member and being disposed in a planar form, the method comprising: a first step of forming a piezoelectric material in a sheet shape to prepare a piezoelectric sheet; a second step of forming the electrode in at least one surface of the piezoelectric sheet; a third step of forming the piezoelectric sheet as a whole in a planar comb shape in which comb teeth are connected to one another in one end to prepare a piezoelectric device substrate in which comb-teeth portions function as a plurality of driving portions; a fourth step of preparing a guide substrate having a concave portion for housing at least a part of the piezoelectric device substrate with unifying integrally them in a predetermined position; and a fifth step of housing the piezoelectric device substrate in the guide substrate to prepare the one-dimensional piezoelectric actuator array in which the plurality of driving portions constituting the piezoelectric device substrate are aligned/arranged in the planar manner.

In the manufacturing method of the one-dimensional piezoelectric actuator array according to the present invention, the order of the first to fifth steps is not limited. Details will be described later, but the order may appropriately be changed, or the steps may also simultaneously be carried out. Additionally, it would naturally be understood that when the steps are replaced, a member to be treated according to each step accordingly changes.

Next, according to the present invention, there is provided a manufacturing method of a two-dimensional piezoelectric actuator array (guide substrate type) comprising structurally aligned pluralities of piezoelectric devices each of which comprises a plate or pillar-shaped piezoelectric member, and at least one pair of electrodes formed on the piezoelectric member; said constitute a piezoelectric device substrate being driven based on a piezoelectric effect of the piezoelectric member and being disposed in a planar form, the method comprising: a step A of forming a piezoelectric material in a sheet shape to prepare a piezoelectric sheet; a step B of forming the electrode in at least one surface of the piezoelectric sheet; a step C of forming the piezoelectric sheet as a whole in a planar comb shape in which comb teeth are connected to one another in one end to prepare a plurality of piezoelectric device substrates in which comb-teeth portions function a plurality of driving portions; a step D of preparing a guide substrate having a concave portion for housing at least a part of the piezoelectric device substrate in a predetermined position in unified form; a step E of housing the piezoelectric device substrate in the guide substrate to prepare the one-dimensional piezoelectric actuator array; and a step F of stacking multiply a plurality of one-dimensional piezoelectric actuator arrays to prepare a two-dimensional piezoelectric actuator array in which the plurality of driving portions constituting the piezoelectric device substrate are structurally aligned/arranged.

Moreover, in the manufacturing method of the two-dimensional piezoelectric actuator array (guide substrate type) according to the present invention, positioning means including a positioning function in hierarchically laminating the plurality of one-dimensional piezoelectric actuator arrays is formed in the guide substrate, and the piezoelectric device substrate is housed in the guide substrate to prepare the one-dimensional piezoelectric actuator array. The function of the positioning means is used to stack multiply the plurality of one-dimensional piezoelectric actuator arrays, and the two-dimensional piezoelectric actuator array is prepared in which the plurality of driving portions constituting the piezoelectric device substrate are aligned/arranged in the structural manner.

In the manufacturing method of the two-dimensional piezoelectric actuator array (guide substrate type) according to the present invention, it is possible to use a through hole and/or marker as the positioning means formed in the guide substrate. The positioning means using the through hole will be described later. Concrete examples of the positioning means by a marker (mark) include a method of using the guide substrate formed of transparent materials such as glass to dispose the marker for the positioning such as a cross mark in the predetermined position.

Also in the manufacturing method of the two-dimensional piezoelectric actuator array (guide substrate type) according to the present invention, the order of the steps A to F is not limited. The details will be described later, but the order may appropriately be changed, or the steps may also simultaneously be carried out. Additionally, it would naturally be understood that when the steps are replaced, a member to be treated according to each step accordingly changes.

Furthermore, according to the present invention, there is provided a manufacturing method of a two-dimensional piezoelectric actuator array (first guide frame member type) comprising structurally aligned plural number of piezoelectric devices each of which comprises a plate or pillar-shaped piezoelectric member, and at least one pair of electrodes formed on the piezoelectric member; said constitute a piezoelectric device substrate being driven based on a piezoelectric effect of the piezoelectric member and being disposed in a planar form, the method comprising: a step 1 of forming a piezoelectric material into a sheet shape to prepare a piezoelectric sheet; a step 2 of forming the electrode in at least one surface of the piezoelectric sheet; a step 3 of forming the piezoelectric sheet as a whole in a planar comb shape in which comb teeth are connected to one another in one end to prepare a piezoelectric device substrate in which comb-teeth portions function a plurality of driving portions; a step 4 of preparing a first guide frame member being of a hollow box shape and having a plurality of pairs of housing guide grooves in two inner surfaces facing each other of the guide frame member in accordance with the number of piezoelectric device substrates to be housed therein the plurality of piezoelectric device substrates in an aligned state in a predetermined position at a predetermined interval, and said guide grooves are arranged at an interval corresponding to a thickness of the piezoelectric device substrate; and a step 5 of housing the plurality of piezoelectric device substrates in the housing guide grooves of the first guide frame member to prepare the two-dimensional piezoelectric actuator array in which the plurality of driving portions constituting the piezoelectric device substrate are aligned/arranged in the structural manner. aligned/arranged.

Moreover, also in the manufacturing method of the two-dimensional piezoelectric actuator array according to the present invention (first guide frame member type), the order of the first to fifth steps is not limited. The details will be described later, but the order may appropriately be changed, or the steps may also simultaneously be carried out. Additionally, it would naturally be understood that when the steps are replaced, the member to be treated according to each step accordingly changes.

BRIEF DESCRIPTION OF THE DRAWINGS

FIG. 1 shows diagrams showing one embodiment of a one-dimensional piezoelectric actuator array according to the present invention.

FIG. 2 shows diagrams showing one embodiment of a two-dimensional piezoelectric actuator array (guide substrate type) according to the present invention.

FIG. 3 shows diagrams showing another embodiment of the two-dimensional piezoelectric actuator array according to the present invention.

FIG. 4 shows diagrams showing one embodiment of the two-dimensional piezoelectric actuator array (first guide frame member type) according to the present invention, FIG. 4(a) is a perspective view, FIG. 4(b) is a perspective view of a first guide frame member which is the constituting element of the two-dimensional piezoelectric actuator array (first guide frame member type), FIG. 4(c) is a front view of the piezoelectric device substrate which is the constituting element of the two-dimensional piezoelectric actuator array (first guide frame member type), and FIG. 4(d) is a rear view showing the piezoelectric device substrate which is the constituting element of the two-dimensional piezoelectric actuator array (first guide frame member type);

FIG. 6 shows diagrams showing still another embodiment of the two-dimensional piezoelectric actuator array (first guide frame member type) according to the present invention, FIG. 6(a) is a perspective view seen from a front side, FIG. 6(b) is a perspective view seen form a rear side before connection of a wiring component, and FIG. 6(c) is a perspective view of the wiring component;

FIG. 8 shows diagrams showing one embodiment of the two-dimensional piezoelectric actuator array (second guide frame member type) according to the present invention.

FIGS. 9(a) to 9(e) are explanatory views showing one example of a manufacturing method of the one-dimensional piezoelectric actuator array according to the present invention;

FIG. 12 shows diagrams showing one example of the piezoelectric device substrate which is the constituting element of the piezoelectric actuator array according to the present invention, FIG. 12(a) is a perspective view, FIG. 12(b) is a front view, and FIG. 12(c) is a rear view;

FIG. 13 shows diagrams showing an example in which the one-dimensional piezoelectric actuator array of the present invention is applied as an actuator of a micro-mirror array.

FIG. 20 shows vertical sectional views showing the application example of a conventional piezoelectric actuator.

DESCRIPTION OF PREFERRED EMBODIMENTS

Embodiments of a piezoelectric actuator array and a manufacturing method of the present invention will be described hereinafter, but the present invention is not limited to nor interpreted by these, and can variously be changed, modified, or improved based on knowledge of a person skilled in the art without departing from the scope of the present invention.

The piezoelectric actuator array according to the present invention indicates arrayed actuators in which a strain induced by an electric field is used, and is not limited to a piezoelectric actuator in which a piezoelectric effect for generating a strain amount substantially proportional to the applied electric field is used in a narrow sense. The array also includes an actuator which uses phenomena such as a electrostrictive effect for generating a strain amount substantially proportional to square of the applied electric field, polarization reverse seen in various ferroelectric materials, and phase transit between an antiferroelectric phase and ferroelectric phase seen in an antiferroelectric material. Whether or not to carry out a polarization treatment is also appropriately determined based on properties of materials for use in a piezoelectric member of a piezoelectric device constituting the piezoelectric actuator. For the piezoelectric actuator array according to the present invention, a mode in which a longitudinal effect is used in the piezoelectric effect is not denied. However, in the following description, the use of a lateral effect advantageous for a constitution with a high aspect ratio is an assumption.

first, a one-dimensional piezoelectric actuator array will be described hereinafter concretely in terms of characteristics with reference to the drawings.

1) Hybrid Structure (Piezoelectric Device Substrate+ Guide Substrate)

Figure 1C:
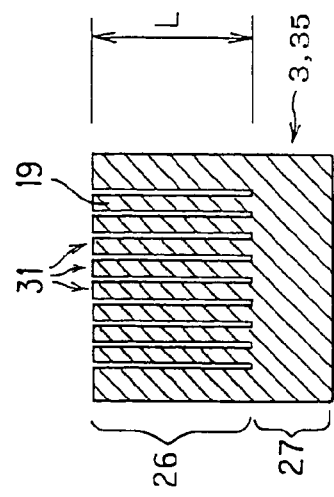
FIG. 1(c) is a rear view of a piezoelectric device substrate constituting the one-dimensional piezoelectric actuator array.
Figure 1D:
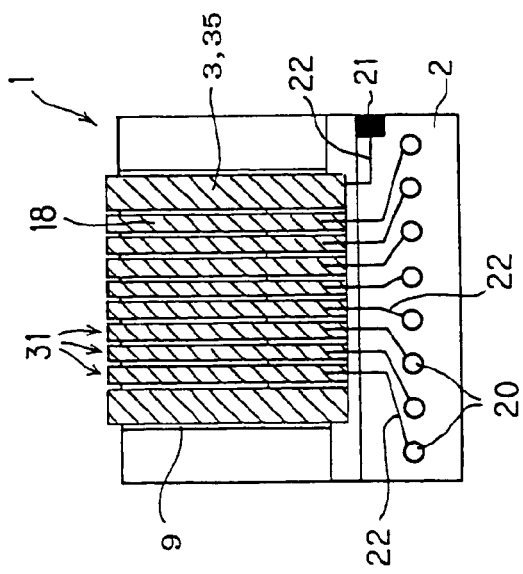
FIG. 1(d) is a perspective view showing a comb-teeth portion of the comb-shaped piezoelectric device substrate constituting the one-dimensional piezoelectric actuator array in an enlarged size.
Figure 1A:
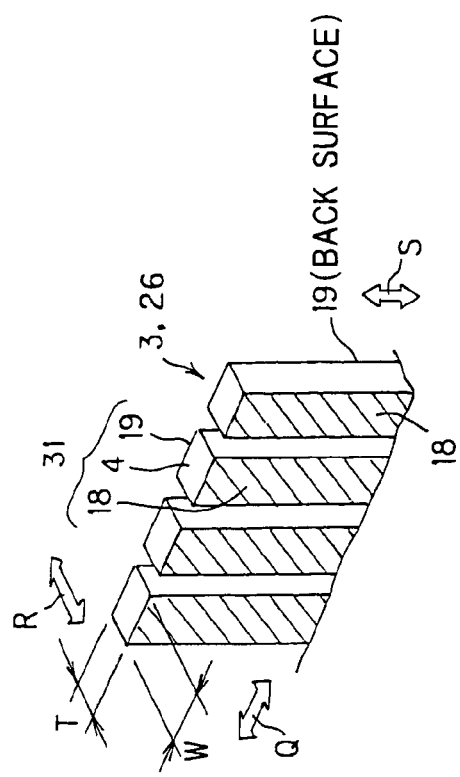
FIG. 1(a) is a plan view.
Figure 1B:
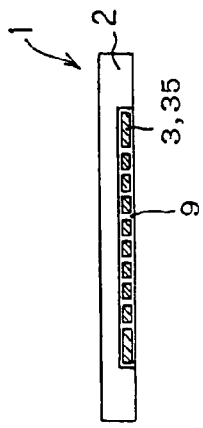
FIG. 1(b) is a plan view.

FIG. 1(a) is a plan view showing one embodiment of the one-dimensional piezoelectric actuator array according to the present invention; FIG. 1(b) is a plan view of the one-dimensional piezoelectric actuator array shown in FIG. 1(a); FIG. 1(c) is diagram showing only a rear surface of a piezoelectric device substrate which is not shown in FIG. 1(a); and FIG. 1(d) is a perspective view showing only a comb-teeth portion of the comb-shaped piezoelectric device substrate in an enlarged size. A one-dimensional piezoelectric actuator array 1 clearly shown in these drawings includes: a piezoelectric device substrate 3 in which a piezoelectric device 35 including a pillar-shaped (plate-shaped) piezoelectric member 4 and a pair of electrodes 18, 19 is formed on a planar form and which is formed as a whole in a planar comb shape including comb teeth connected to one another in one end and in which comb-teeth portions constitute driving portions 31; and a guide substrate 2 having a concave portion 9 for housing the piezoelectric device substrate 3 therein. The guide substrate 2 and piezoelectric device substrate 3 are integrally unified to constitute a hybrid structure, thereby thus unified substrates may be used for the formation of the multiply-stuck structural body. When a voltage is applied between the electrodes 18, 19, the piezoelectric device substrate 3 is contracted/displaced in a drawing direction (direction connecting tip ends of comb teeth 26 to comb ribs 27) of the comb teeth 26 by a piezoelectric lateral effect to drive the piezoelectric actuator (i.e., the displacement direction is equal to a comb-teeth direction).

In general in a constitution in which the piezoelectric device is elongated with a high aspect ratio in order to establish both a high generation force and large displacement, even when the piezoelectric member constituting the piezoelectric device is, for example, sintered ceramic, a mechanical strength drops, handling properties worsen, and deformation such as warpage and bend sometimes occurs mainly because of a piezoelectric device weight. With the deformation, even when the large displacement is obtained with the high generation force, a shift from an intended operation point increases at a driving time. In this manner, there is a possibility that the a satisfactory function of the actuator cannot be fulfilled.

Moreover, when the piezoelectric actuator is applied to various micro-devices, the tip end (operation point) of the piezoelectric device needs to be aligned with or connected to a member for carrying out displacement transmission in manufacturing the actuator. However, it is apparent that this operation is very precise and has difficulty. In the piezoelectric actuator array in which a large number of piezoelectric devices are aligned, troubles are easily generated. For example, the devices interfere with or are caught by other members at an alignment operation time. When the guide substrate is not disposed, an impact exceeding a limit of mechanical strength is added to the piezoelectric device, and other phenomena occur. There is a problem that the device is easily broken.

The one-dimensional piezoelectric actuator array 1 of the present embodiment includes the hybrid structure including the guide substrate 2 having a concave portion 9 for housing at least one part of the piezoelectric device substrate 3 in a predetermined position, in addition to the piezoelectric device substrate 3 constituted of the piezoelectric device 35. Therefore, the above-described problem can be avoided. That is, even when the piezoelectric device 35 itself is deformed, the guide substrate 2 itself protects the piezoelectric device 35, and additionally controls the deformation in a predetermined range. Even when an external force other than expected is applied to the piezoelectric device 35, the guide substrate 2 controls the deformation of the piezoelectric device 35 within the predetermined range, and accordingly the device is not easily broken. Furthermore, since the driving portions 31 of the piezoelectric device 35 are exactly positioned by the guide substrate 2, the piezoelectric device can be connected to the displacement transmission member without being aligned, and the handling properties are remarkably enhanced in this manner.

When the piezoelectric device 35 (driving portions 31) is deformed, the driving portions 31 contact the guide substrate 2 and are simultaneously displaced. However, the driving portions 31 having a high aspect ratio has a higher generation force. Additionally, the guide substrate 2 can be prepared using a suitable material so that friction caused by contact with the electrode 19 of the piezoelectric device 35 is reduced. Alternatively, when the substrate is subjected to a surface treatment or coating, the drop of the displacement can be prevented.

As shown in FIGS. 1(a) and 1(b), in the one-dimensional piezoelectric actuator array 1 of the present embodiment, the concave portion 9 for housing is formed in the guide substrate 2. The piezoelectric device substrate 3 and the guide substrate 2 are unified integrally by housing at least a part of the substrate 3 to the substrate 2 in such a manner that one end surface of the piezoelectric device substrate 3 is embraced by the guide substrate by disposing the guide substrate at the vicinity of said one end surface of the piezoelectric device substrate 3. The piezoelectric device substrate 3 is housed in the guide substrate 2 with securing a slight gap therebetween. One driving portion 31 is unified integrally with another driving portion 31 at a portion including the comb rib 27 of the piezoelectric device substrate 3 since the piezoelectric member 4 constituting said one driving portion is unified with the piezoelectric member 4 constituting said another driving portion 31 at that comb rib. Additionally, the piezoelectric device substrate is housed, with directing its surface in which the electrode 19 is formed to the guide substrate 2. Thus, the positioning of the resultant piezoelectric device substrate is controlled within the predetermined range. Therefore, as shown, a possibility that the operation point (corresponding to the tip end portion of the comb teeth 26) at the driving time shifts or fluctuates is remarkably small, while the driving portions 31 of the piezoelectric device 35 have the high aspect ratio.

For a relation between the piezoelectric device substrate and guide substrate, that is, for a mode of integration, the guide substrate may be disposed in the vicinity of at least one surface of the piezoelectric device substrate or may contact the piezoelectric device substrate. The guide substrate is not limited to the shown mode as long as the respective driving portions of the piezoelectric device substrate are arranged in the predetermined range. With the one-dimensional piezoelectric actuator array 1 for practical use, when the guide substrate 2 is disposed on a lower side (laterally laid), a force of gravity is exerted so as to bring the piezoelectric device substrate 3 into contact with the guide substrate 2. Even in the case that the array is practically used in a vertically disposed state of the guide substrate, the nude shown in FIGS. 1(a) and (b) may also be used. However, in this case, it is preferable to dispose the guide substrate in the vicinity of both main surfaces of the piezoelectric device substrate, or to make it contact with the both surfaces while this mode is not depicted. This may be realized, when a lid plate is attached later as a part of the guide substrate, or when the guide substrate having a thin hollow portion is prepared and the piezoelectric device substrate is inserted in the hollow portion. It is to be noted that in the present specification the term "main surface" in any one of the piezoelectric device substrate, the piezoelectric device, or the piezoelectric member means a surface on which the electrode is formed or is to be formed.

Moreover, although not shown, all the portions of the guide substrate disposed in the vicinity of or in contact with the piezoelectric device substrate may not have a planar shape. Depending on the aspect ratio of the driving portion of the piezoelectric device constituting the piezoelectric device substrate, when the guide substrate is disposed in the vicinity of or in contact with the piezoelectric device substrate (piezoelectric device) only in the vicinity of the operation point at the driving time (comb teeth tip ends), it is possible to sufficiently secure the positioning precision of the piezoelectric device, which is one of objects. Needless to say, a mode can freely be used in which the guide substrate is disposed in the vicinity of or in contact with the piezoelectric device substrate (piezoelectric device) by a point (meaning a small plane) in one place or a plurality of places in the comb-teeth tip end and a middle portion of the comb teeth (between the comb-teeth tip end and comb rib). The use of this mode may appropriately be determined in accordance with the mechanical strength of the piezoelectric device influenced mainly by the aspect ratio or the use mode of the actuator (vertically or horizontally disposed).

Furthermore, for the guide substrate, projections and/or ridges are disposed at an interval corresponding to the width of the driving portion in the bottom surface of the concave portion for housing, and the projections and/or ridges are preferably inserted among the plurality of driving portions to form the guide substrate integrally with the piezoelectric device substrate. There is not a large difference between a distance between main surfaces (T in the piezoelectric member 4 of the driving portion 31 shown in FIG. 1(d), also referred to as the thickness) and a distance between side surfaces (W in the same, also referred to as the width) in the piezoelectric device (a section of the comb tooth of the piezoelectric device vertical to the drawing direction has a shape close to a square). Alternatively, the distance between the main surfaces is extremely smaller than the distance between the side surfaces. Even in this piezoelectric device, when the deformation is suppressed in the opposite main surfaces, and when the driving portion of the piezoelectric device is set to the high aspect ratio, there is a possibility of deformation not in a direction between the main surfaces (direction R in FIG. 1(d)) but in a direction between the side surfaces (i.e., an adjacent direction of the driving portions in the same piezoelectric device substrate, direction Q in FIG. 1(d)). Even this deformation can be suppressed within the predetermined range.

Furthermore, the one-dimensional piezoelectric actuator array 1 shown in FIGS. 1(a) to 1(d) has the following predetermined characteristics common to the one-dimensional piezoelectric actuator array according to the present invention.

2) Mutually Independent Piezoelectric Device

In the one-dimensional piezoelectric actuator array 1, a plurality of driving portions 31 of the piezoelectric device substrate 3, each of which includes the piezoelectric member 4 and a pair of electrodes 18, 19, are arranged as a whole in a planar form. As shown, the whole piezoelectric device substrate 3 has a comb shape, but this is the shape of the piezoelectric member 4. The common electrode 19 is formed substantially in the whole surface disposed opposite to the guide substrate 2 of the piezoelectric device substrate 3. On the other hand, the electrode 18 is formed for each of the comb teeth 26 of the comb shape. Therefore, the driving portion 31 to which the voltage is to be applied can be selected by the electrode 18. Each driving portion 31 (there are eight driving portions 31 (comb teeth 26) in the one-dimensional piezoelectric actuator array 1) can be driven independently of the driving of the adjacent driving portion 31. That is, an operation of expanding one driving portion and contracting another driving portion is possible. When the size of the voltage to be applied to each driving portion is changed, a contraction/expansion amount can be adjusted.

3) Forming of Wiring Circuit in Guide Substrate

In the one-dimensional piezoelectric actuator array 1, as shown in FIGS. 1(a) and 1(b), the electrodes 18, 19 are formed in the opposite surfaces of the piezoelectric member 4 (surfaces which are disposed opposite to each other and between which a distance is shorter). That is, the electrodes 18, 19 are formed in the surfaces including long sides in a case in which the shape of the section of the comb tooth 26 of the piezoelectric member 4 extending vertical to the drawing direction is rectangular (the rectangular shape is one mode of a parallelogram).

Moreover, a wiring circuit for applying the voltage to the piezoelectric member 4 is formed in the guide substrate 2. The circuit includes wirings 22 and electrode terminals 20, 21 for connecting one pair of electrodes 18, 19 to a power source (not shown). Needless to say, the wirings 22 may be conductive lines, but the guide substrate 2 may directly be coated with a conductive material to form the wirings. When the electrode terminals 20, 21 are formed apart from the piezoelectric device 35 including the driving portions 31 in this manner, a power source connection operation is facilitated later, and yield drop caused by a manufacturing process can be prevented.

For the wiring circuit, the one-dimensional piezoelectric actuator array according to the present invention is not limited to the shown mode of the one-dimensional piezoelectric actuator array 1. For example, it is possible to constitute the guide substrate only of a portion for housing and integrally unified the piezoelectric device substrate, and it is also possible to form the wiring circuit for connecting the electrodes of the piezoelectric device to the power source in a separately disposed wiring substrate. In this case, the one-dimensional piezoelectric actuator array is constituted of three substrates including the piezoelectric device substrate, guide substrate, and wiring substrate.

4) Driving Portion of Piezoelectric Device Having High Aspect Ratio

In general, the individual piezoelectric devices constituting the piezoelectric actuator generate the displacement in accordance with the following equation.

$$X_B = \frac{L}{T} \times d_{31} \times V \quad \text{[Equation 1]}$$

On the other hand, a stress $F_B$ is generated in accordance with the following equation.

$$F_B = W \times \frac{d_{31}}{S_{11}^E} \times V \quad \text{[Equation 2]}$$

That is, the displacement and generation force can separately be designed. Here, T denotes the thickness of the piezoelectric member, L denotes the height, and W denotes the width.

$$S_{11}^E \quad \text{[Equation 3]}$$

The above is an elasticity compliance. Therefore, as seen from these equations, the thickness T of the piezoelectric member is reduced and the height L is increased. This shape is advantageous for setting the displacement to be consistent with the generation force. It has heretofore been difficult to handle a plate material which has a large aspect ratio (L/T), and it has been impossible to arrange the members with good precision.

In the one-dimensional piezoelectric actuator array 1 according to the present invention, in a manufacturing method described later, a plurality of driving portions 31 constituting the piezoelectric device are not individually handled, or do not have to be individually arranged, and are easily formed integrally into the comb-shaped piezoelectric device substrate 3 in which the flat-plate piezoelectric sheet is slit-processed. The guide substrate 2 is formed integrally with the piezoelectric device substrate 3, and the individual driving portions 31 constituting the piezoelectric device 35 are also held and positioned by the guide substrate 2. Therefore, the aspect ratio of the driving portion 31 of the piezoelectric device 35 can be set to be high in a range of 10 to 1000. The driving portions can be constituted so as to obtain a large displacement and generation force with a low driving voltage.

5) Piezoelectric Member Superior in Straightness of Axial Line

In the one-dimensional piezoelectric actuator array 1, the straightness of the axial line with respect to the piezoelectric member 4 constituting the driving portion 31 of the piezoelectric device 35 can be maintained to be remarkably small by a guide structure and manufacturing method described later. That is, the piezoelectric member 4 having an elongated rectangular parallelepiped shape can maintain a shape remarkably close to the rectangular parallelepiped shape which is geometrically correct without any deformation. Therefore, it is easy to obtain the displacement and generation force in an intended direction with an intended amount. There is an advantage that the characteristics of the piezoelectric device 35 can efficiently be used. Since the straightness of the axial line is superior, the operation point at the driving time does not easily shift. A high resistance to reaction caused by the pushing or hitting of a certain object is obtained. Even when the piezoelectric member has a high aspect ratio and an elongated shape, damages such as breakage and crack are not easily caused.

6) Contraction/Expansion Displacement

For the one-dimensional piezoelectric actuator array 1, different from a conventional flexure displacement device, the electric field induced strain of the contraction/expansion of the piezoelectric member is not converted to the displacement in a flexure mode for use. Instead the contraction/expansion of the piezoelectric member 4 is used as such as the displacement (i.e., the height L of the piezoelectric member 4 corresponds to that in the displacement direction at a time when the displacement is not caused) in the piezoelectric actuator. Therefore, it is easy to determine a designed value for obtaining a large displacement without lowering the generation force and response.

Next, the two-dimensional piezoelectric actuator array (guide substrate type) will be described concretely in terms of the characteristics with reference to the drawings.

In the two-dimensional piezoelectric actuator array (guide substrate type) according to the present invention, a plurality of one-dimensional piezoelectric actuator arrays according to any type of the present invention described above are multiply stuck, thereby a plurality of driving portions are structurally aligned/arranged. That is, at least a plurality of piezoelectric device substrates in which the plurality of driving portions are arranged in the planar manner are multiply stuck, while the guide substrates are sandwiched between the respective pairs of the piezoelectric device substrates. Therefore, one set of multiply stuck piezoelectric device substrate and guide substrate can have the same mode as that of the above-described one-dimensional piezoelectric actuator array. In this case, the two-dimensional piezoelectric actuator array (guide substrate type) according to the present invention has characteristics conforming to the above 1) to 6). Additionally, the array having the following characteristics may be obtainable by employing the multiply stuck structure.

7) Two-dimensionally Aligned/Arranged Piezoelectric Devices

Figure 2A:
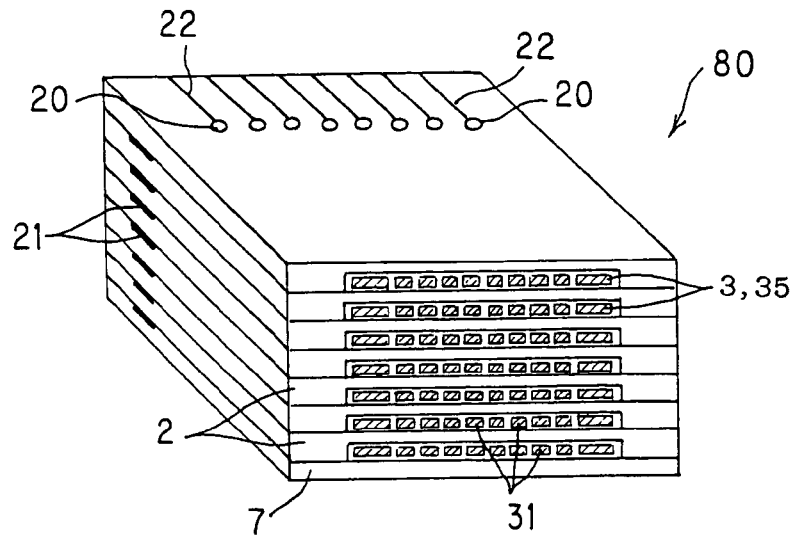
FIG. 2(a) is a perspective view.
Figure 2B:
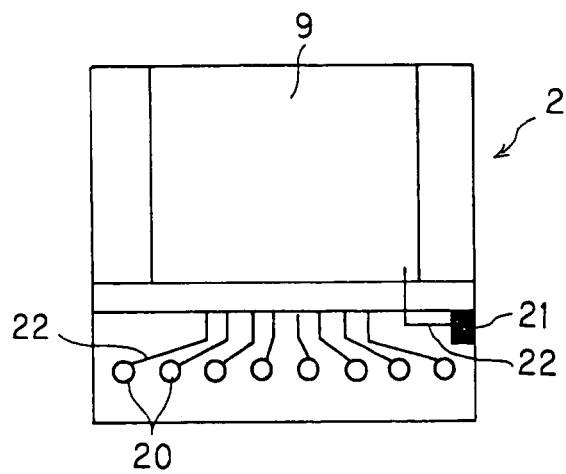
FIG. 2(b) is a plan view of a guide substrate which is a constituting element of the two-dimensional piezoelectric actuator array (guide substrate type)
Figure 2C:
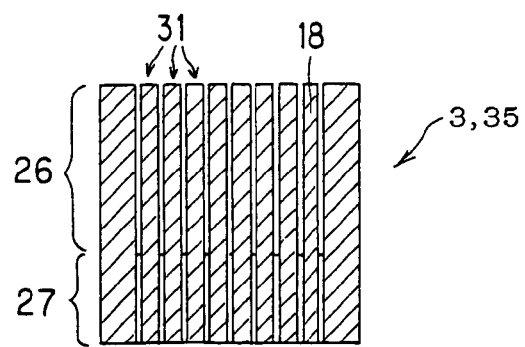
FIG. 2(c) is a front view of the piezoelectric device substrate which is the constituting element of the two-dimensional piezoelectric actuator array (guide substrate type)

FIG. 2(a) is a perspective view showing one embodiment of the two-dimensional piezoelectric actuator array (guide substrate type) according to the present invention; FIG. 2(b) is a plan view of the guide substrate which is the constituting element of the two-dimensional piezoelectric actuator array (guide substrate type); and FIG. 2(c) is a front view of the piezoelectric device substrate. As shown in FIG. 2(a), for the characteristics of a two-dimensional piezoelectric actuator array (guide substrate type) 80, a plurality of piezoelectric device substrates 3 in which a plurality of driving portions 31 are arranged in the planar manner are stuck multiply, with sandwiching each of the guide substrates 2 between the respective pairs of piezoelectric device substrates. The respective driving portions 31 constituting the piezoelectric device 35 are independently aligned/arranged in the structural manner.

The plurality of piezoelectric device substrates 3 are three-dimensionally positioned by the guide substrates 2. The respective piezoelectric device substrates 3 are independent of one another, while the guide substrates 2 are held among the piezoelectric device substrates. Additionally, for each piezoelectric device substrate 3, the plurality of driving portions 31 integrally formed by the comb ribs 27 are arranged in the planar form, and an adhesive is not disposed in a portion related to the arrangement of the driving portions 31 in the plane in this structure. Therefore, needless to say, an initial piezoelectric device (driving portion) dimension and a pitch of the piezoelectric device (driving portion) have high accuracy. A phenomenon of deterioration of intervening materials does not occur. Therefore, high dimension accuracy and piezoelectric characteristics can be maintained over a long period.

For the two-dimensional piezoelectric actuator array (guide substrate type) 80, the plurality of piezoelectric device substrates 3 are stuck multiply, with sandwiching each of the guide substrates 2 between the respective pairs of piezoelectric device substrates. Therefore, as apparent from the manufacturing method described later, the array can be prepared without being subjected to processing steps such as three-dimensional forming/cutting. Therefore, the manufacturing process is simplified, and the production cost can be reduced.

The three-dimensional arrangement of the driving portions of the two-dimensional piezoelectric actuator array (guide substrate type) according to the present invention is not limited to an orthogonal arrangement as in the shown two-dimensional piezoelectric actuator array (guide substrate type) 80. The arrangement such as a checkered flag-like shape, a fan-like form or the like may freely be determined in accordance with purposes and uses. Only when the comb shape is changed for each of the multiply stuck piezoelectric device substrates, the number and arrangement of the driving portions constituting the piezoelectric device can arbitrarily be changed.

Moreover, when a method easy in attachment/detachment such as a fastening method using a bolt/nut is used as a method of bonding the plurality of multiply stuck piezoelectric device substrates 3 to the plurality of guide substrates 2 (including a lid plate 7 of a lowermost layer in FIG. 2(a)), it is possible to increase/decrease the number of piezoelectric device substrates 3 if necessary. There is an advantage that a degree of freedom in design increases. Furthermore, when some of the driving portions break down, the piezoelectric device substrate including the broken-down driving portions is changed, this breakdown can thus be handled, and maintenance properties are superior.

For the individual piezoelectric device substrates 3, as shown in FIGS. 2(a) and 2(c), in the same manner as in the one-dimensional piezoelectric actuator array 1, each substrate is formed to as a whole have a planar comb shape in which the comb teeth 26 are connected to one another in one end (comb ribs 27). The portions including the cam teeth 26 are formed to constitute the plurality of driving portions 31, and the plurality of pillar-shaped (plate-shaped) driving portions 31 are arranged in the planar form (in FIG. 2(a), the tip ends of the comb teeth 26 in FIG. 2(c) appear). The whole piezoelectric device substrate 3 has the comb shape, but this is the shape of the piezoelectric member. As shown in FIG. 2(c), the electrodes 18 are formed opposite to the individual comb teeth 26 in one surface of the comb-shaped piezoelectric member (the lower surface of the piezoelectric device substrate 3 in FIG. 2(a)). Moreover, the common electrode 19 is formed substantially as a whole in the other surface of the piezoelectric member (the surface of the piezoelectric device substrate 3 disposed opposite to the guide substrate 2 (the upper surface in FIG. 2(a), the rear surface which does not appear in FIG. 2(c)) so that the piezoelectric device substrate 3 is formed. That is, the piezoelectric device 35 is formed in the comb shape, and the electrodes 18, 19 are formed in the opposite surfaces of the piezoelectric member.

The guide substrate 2 holds and positions the piezoelectric device substrate 3, and has a concave portion 9 slightly larger than the outer shape of the piezoelectric device substrate 3 (slightly concave planar portion) as shown in FIG. 2(b). When the piezoelectric device substrates 3 are stuck, the piezoelectric device substrates are housed (inserted) in the concave portion 9 for housing.

Moreover, the wiring circuit for applying the voltage to the piezoelectric member constituting the driving portion 31 of the piezoelectric device 35 is formed in the guide substrate 2. The circuit includes the wirings 22 and electrode terminals 20, 21 for connecting one pair of electrodes 18, 19 in the inserted piezoelectric device substrate 3 to the power source (not shown). Moreover, in the multiply stuck structural body shown in FIG. 2(a), the electrode terminals 20 connected to the electrodes 18 formed opposite to the individual comb teeth 26 are independent of one another in the same piezoelectric device substrate 3, and are connected to one another in the different piezoelectric device substrates 3 through the guide substrates 2 to form the common electrode.

On the other hand, as described above, the electrode 19 is formed over the whole surface disposed opposite to the surface in which the electrode 18 of the comb-shaped piezoelectric member is formed, and is connected as the common electrode to the electrode terminal 21 of the guide substrate 2 in the same piezoelectric device substrate 3. The electrode terminals 21 of the different piezoelectric device substrates 3 are independent of one another without being conducted as shown in FIG. 2(*a*).

Therefore, even in the two-dimensional piezoelectric actuator array (guide substrate type) 80 including the two-dimensionally arranged piezoelectric devices by combinations of the electrode terminals 20 (electrodes 18) and electrode terminal 21 (electrode 19), in the same manner as in the one-dimensional piezoelectric actuator array 1 described in the above "2) Mutually Independent Piezoelectric Device", the driving portion 31 to which the voltage is to be applied can be selected. The driving portion 31 can independently be driven regardless of the other driving portion 31.

It is to be noted that in the two-dimensional piezoelectric actuator array (guide substrate type) 80 shown in FIG. 2(*a*), since a lowermost layer does not require the wiring circuit, the lid plate 7 is attached instead of the guide substrate 2.

8) Highly Integrated Piezoelectric Devices

The driving portions 31 of the piezoelectric devices constituting the two-dimensional piezoelectric actuator array (guide substrate type) 80 shown in FIG. 2(*a*) includes a structure in which the electrode is formed in a film form in an outer surface of the piezoelectric member, and the piezoelectric member can be formed to be remarkably thin by the manufacturing method described later.

Moreover, one pair of the multiply stuck piezoelectric device substrate 3 and guide substrate 2 in the two-dimensional piezoelectric actuator array (guide substrate type) 80 has the same mode as that of the one-dimensional piezoelectric actuator array 1 shown in FIGS. 1(*a*) to 1(*d*). In one piezoelectric device substrate 3, for the plurality of driving portions 31, the piezoelectric member 4 portions are integrally formed by the comb ribs 27 of the piezoelectric device substrate 3. The piezoelectric devices 35 (driving portions 31) can be formed without being individually handled or being individually arranged. Therefore, the driving portions 31 are arranged in the same piezoelectric device substrate 3, and the interval between the adjacent driving portions 31 is remarkably small. Furthermore, as described in paragraphs of the above "1) Hybrid Structure", the guide substrate 2 includes the projections and/or ridges arranged at the interval corresponding to the width of the driving portion 31 in the bottom surface of the concave portion 9 for housing, the projections and/or ridges are inserted among the plurality of driving portions 31, and the guide substrate 2 is integrally formed with the piezoelectric device substrate 3. When the projections and/or ridges are disposed in the vicinity of or in contact with the side surface of the driving portion 31, even the deformation in the direction between the side surfaces of the piezoelectric device 35 can be suppressed in the predetermined range. Therefore, the interval between the driving portions 31 disposed adjacent to each other in the same piezoelectric device substrate 3 can further be reduced.

Additionally, for the two-dimensional piezoelectric actuator array (guide substrate type) 80, the guide substrates 2 disposed among the plurality of piezoelectric device substrates 3 can also be prepared to be remarkably thin by the use of materials described later. Therefore, the interval between a pair of the piezoelectric device substrates 3 multiply stuck and sandwiched by the guide substrate 2, that is, the interval between the driving portions 31 disposed adjacent to each other in the different piezoelectric device substrates 3 can remarkably be reduced.

That is, the driving portion 31 itself of the piezoelectric device can be formed to be remarkably thin and small. The interval between the adjacent driving portions 31 is formed to be remarkably small. Therefore, the driving portions 31 of the piezoelectric devices 35 can be disposed with a high integration which has not heretofore been achieved. In the same manner as in the one-dimensional piezoelectric actuator array 1 described in the paragraphs of "4) Driving Portion of Piezoelectric Device having High Aspect Ratio", the driving portions of the piezoelectric devices having the high aspect ratio can be arranged with the high density. Concretely, for the arrangement density of the driving portions 31, the ratio of the height L of the driving portion 31 to the interval between the adjacent driving portions 31 is approximately 10:1 to 1000:1. The two-dimensional piezoelectric actuator array (guide substrate type) 80 having such high integration is preferable as the actuator for use in the optical switch for the photonic router.

Figure 3B:
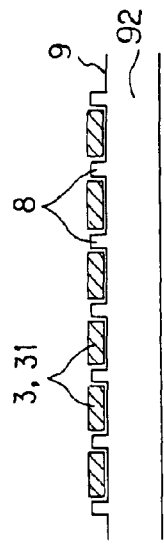
FIG. 3(b) is an enlarged view of a piezoelectric device portion in FIG. 3(a)
Figure 3A:
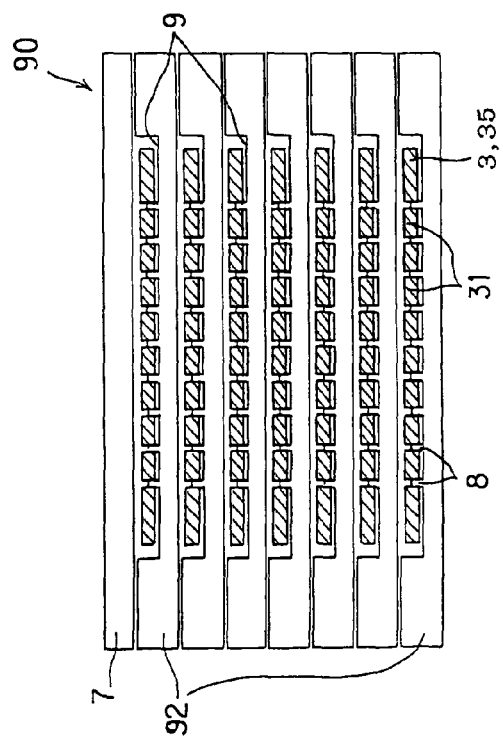
FIG. 3(a) is a plan view.
Figure 3C:
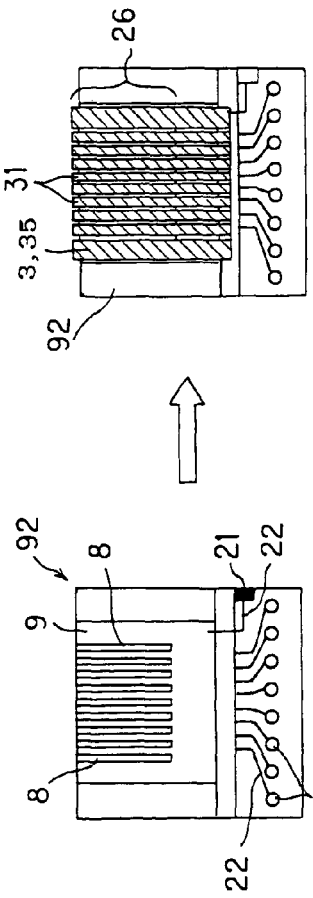
FIG. 3(c) is an explanatory view showing that the piezoelectric device substrate is inserted in the guide substrate.

Subsequently, the embodiment of the piezoelectric actuator array according to the present invention will be described with reference to the drawings. FIG. 3(*a*) is a plan view showing another embodiment of the two-dimensional piezoelectric actuator array (guide substrate type) according to the present invention. FIG. 3(*b*) is an enlarged view of a piezoelectric device portion in FIG. 3(*a*), and FIG. 3(*c*) is an explanatory view showing that the piezoelectric device substrate is inserted in the guide substrate.

A two-dimensional piezoelectric actuator array (guide substrate type) 90 shown in FIG. 3(*a*) is the same as the two-dimensional piezoelectric actuator array (guide substrate type) 80 excluding that a guide substrate 92 including ridges 8 is used. Therefore, the array has the above characteristics 1) to 8).

Furthermore, as described in the paragraphs of "1) Hybrid Structure" in the description of the one-dimensional piezoelectric actuator array 1, the ridges 8 of the guide substrate 92 are inserted in gaps among the plurality of driving portions 31 of the piezoelectric device substrate 3 housed (inserted) in the concave portion 9 of the guide substrate 92 (see FIGS. 3(*a*) and 3(*b*)). A mode disposed in the vicinity of or in contact with the side surfaces of the driving portion 31 is used, and accordingly not only the deformation in the direction between the main surfaces of the driving portion 31 but also the deformation in the direction between the side surfaces can be suppressed within the predetermined range. Therefore, for the two-dimensional piezoelectric actuator array (guide substrate type) 90, the interval between the driving portions 31 disposed adjacent to each other in the same piezoelectric device substrate 3 can further be reduced, and it is possible to arrange the driving portions 31 with a higher density. The interval between the driving portions 31 disposed adjacent to each other can be set to 50 μm or less. It is to be noted that the interval (pitch) between the adjacent driving portions 31 may be either even or uneven (scattered). Therefore, the application as the actuator for use in the optical switch for the photonic router developed in the future is anticipated.

As shown in FIG. 3(*c*) (left side), in the guide substrate 92, the ridge 8 is disposed in accordance with the length of the comb teeth 26 portion of the piezoelectric device substrate 3. Therefore, as shown in FIG. 3(*c*) (right side), when the piezoelectric device substrate 3 is inserted in the guide substrate 92, the whole side surface of the driving portion 31 is continuously disposed in the vicinity of or in contact with the ridges 8, and even the slight deformation in the direction between the side surfaces of the driving portion 31 can be prevented. This ridge is a preferable mode, but a segmented ridge or small projections disposed at intervals may also be used depending on the mechanical strength of the driving portion 31 of the piezoelectric device 35.

Next, the two-dimensional piezoelectric actuator array (first guide frame member type) will be described concretely in terms of the characteristics with reference to the drawings.

The two-dimensional piezoelectric actuator array according to the present invention includes: the piezoelectric device substrate; and a first guide frame member being a hollow box shape and having a plurality of pairs of housing guide grooves in two inner surfaces facing each other in accordance with the number of piezoelectric device substrates, in which a plurality of piezoelectric device substrates are housed in an aligned state in predetermined positions at predetermined intervals and which are arranged at an interval corresponding to the thickness of the piezoelectric device substrate. The plurality of piezoelectric device substrates are inserted/housed in the corresponding guide grooves of the first guide frame member, and the plurality of driving portions are aligned/arranged in the structural manner. By this structure, the array has the following characteristics.

9) Two-dimensionally Aligned/Arranged Piezoelectric Devices

FIGS. 4(a) to 4(d) are diagrams showing one embodiment of the two-dimensional piezoelectric actuator array (first guide frame member type) according to the present invention; FIG. 4(a) is a perspective view; FIG. 4(b) is a perspective view of a first guide frame member which is the constituting element of the two-dimensional piezoelectric actuator array (first guide frame member type); FIG. 4(c) is a front view of the piezoelectric device substrate which is the constituting element of the two-dimensional piezoelectric actuator array (first guide frame member type); and FIG. 4(d) is a rear view showing the piezoelectric device substrate which is the constituting element of the two-dimensional piezoelectric actuator array (first guide frame member type). A two-dimensional piezoelectric actuator array (first guide frame member type) 110 includes: a plurality of piezoelectric device substrates 3 in which a plurality of driving portions 31 are arranged; and a first guide frame member 112 which houses and holds the substrates and in which predetermined guide grooves 111 are formed. When the voltage is applied between the electrodes 18, 19, the piezoelectric member constituting the driving portion 31 of the piezoelectric device 35 causes contraction/expansion displacement in the drawing direction (direction connecting the comb teeth 26 tip ends to the comb ribs 27) by the piezoelectric lateral effect to drive the piezoelectric actuator (i.e., the displacement direction is equal to the drawing direction of the comb teeth).

As described above, in the constitution in which the driving portion of the piezoelectric device is elongated with the high aspect ratio in order to establish both the high generation force and large displacement, the mechanical strength drops, the handling properties worsen, and the deformation sometimes occurs. With the deformation, there is a possibility that the satisfactory function of the actuator cannot be fulfilled. Moreover, for example, when the piezoelectric actuator is applied to various micro-devices, the tip end (operation point) of the driving portion of the piezoelectric device needs to be aligned with or connected to the member for carrying out displacement transmission in manufacturing the actuator. However, it is apparent that this operation is very precise and has high difficulty. In the piezoelectric actuator array in which a large number of driving portions of the piezoelectric devices are aligned, the troubles are easily generated. For example, the portions interfere with or are caught by the other members at the alignment operation time. There is a problem that the impact exceeding the limit of the mechanical strength is added to the piezoelectric device and that device is easily broken.

The two-dimensional piezoelectric actuator array (first guide frame member type) 110 of the present embodiment shown in FIG. 4(a) includes the structure including the first guide frame member 112 in which the guide grooves 111 for housing and holding the piezoelectric device substrate 3 are formed in addition to the piezoelectric device substrate 3 including the plurality of driving portions 31. That is, since the driving portion 31 of the piezoelectric device 35 is exactly positioned by the first guide frame member 112, the piezoelectric device itself can be connected to the displacement transmission member without being aligned, and the handling properties are remarkably enhanced. Therefore, at the alignment operation time, the trouble that the driving portion 31 of the piezoelectric device 35 interferes with or is caught by the other member does not easily occur, and the array is not easily deformed/broken.

As shown in FIG. 4(d), 4(d), the driving portions 31 of the plurality of piezoelectric devices 35 are integrally formed in the portions of the comb ribs 27 of the piezoelectric device substrate 3 in the piezoelectric member constituting the driving portions. Therefore, as shown, the driving portions 31 of the piezoelectric device 35 have the high aspect ratio, but the possibility that the operation point (corresponding to the tip end portion of the comb teeth 26) at the driving tire shifts or fluctuates is remarkably small.

Moreover, the plurality of piezoelectric device substrates 3 are three-dimensionally positioned, when the substrates are housed in the first guide frame member 112, especially when a support portion 141 of the piezoelectric device substrate 3 is inserted in/supported by the guide groove 111. Moreover, for each piezoelectric device substrate 3, the driving portions 31 integrally formed by the comb rib 27 are arranged in the planar form, and an adhesive is not disposed in a portion related to the arrangement of the driving portions in the plane in this structure. Therefore, needless to say, the initial piezoelectric device (driving portion) dimension and the pitch of the piezoelectric device (driving portion) have high accuracy. The phenomenon of deterioration of the intervening materials cannot occur. Therefore, the high dimension accuracy and piezoelectric characteristics can be maintained over the long period.

For the two-dimensional piezoelectric actuator array (first guide frame member type) 110, the plurality of piezoelectric device substrates 3 are housed/held in the first guide frame member 112. Therefore, as apparent from the manufacturing method described later, the array can be prepared without being subjected to the processing steps such as the three-dimensional forming/cutting. Therefore, the manufacturing process is simplified, and the cost can be reduced.

The three-dimensional arrangement of the driving portions of the two-dimensional piezoelectric actuator array (first guide frame member type) according to the present invention is not limited to the orthogonal arrangement as in the shown two-dimensional piezoelectric actuator array (first guide frame member type) 110. The arrangements such as the hound's tooth check form and fan form can freely be determined in accordance with the purposes and uses. Only when the comb shape is changed for each of the piezoelectric device substrates housed/held in the first guide frame member, the number and arrangement of the driving portions constituting the piezoelectric device can easily and arbitrarily be changed.

For the first guide frame member 112, the plurality of pairs of guide grooves 111 for housing the piezoelectric device substrates are formed in the two inner surfaces facing each other (FIG. 4(b)). When the piezoelectric device substrate 3 is inserted/housed in each of the guide grooves 111, the piezoelectric device substrates 3 can be positioned/held at predetermined intervals.

Figure 5:
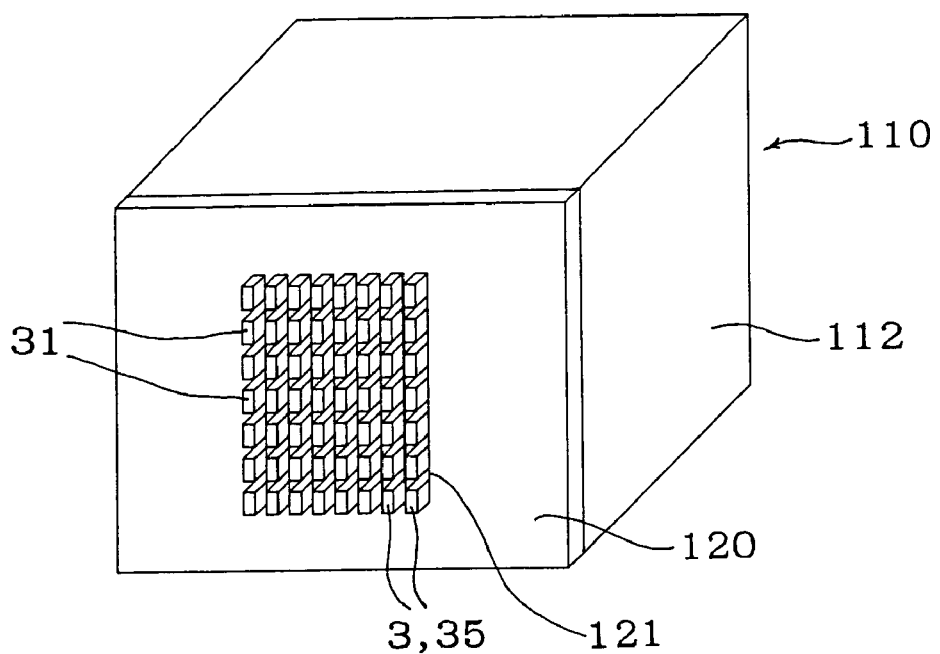
FIG. 5 is a perspective view showing another embodiment of the two-dimensional piezoelectric actuator array (first guide frame member type) according to the present invention.

FIG. 5 is a perspective view showing another embodiment of the two-dimensional piezoelectric actuator array (first guide frame member type) according to the present invention. As shown in FIG. 5, the two-dimensional piezoelectric actuator array (first guide frame member type) 110 of the present embodiment further includes: a lid member 120 in which slits 121 having shapes corresponding to those of the tip ends of the driving portions 31 are formed at substantially the same interval as that of the adjacent guide grooves 111, and the tip ends of the plurality of driving portions 31 are preferably inserted in the slits 121 and positioned. When the lid member 120 including the slits 121 is used to position the tip ends of the driving portions 31, a higher dimension accuracy can be obtained, and this is also convenient for the manufacturing steps.

FIG. 6(a) is a perspective view seen from a front side, showing still another embodiment of the two-dimensional piezoelectric actuator array (first guide frame member type) according to the present invention; FIG. 6(b) is a perspective view seen from a rear side before connection of the wiring component; and FIG. 6(c) is a perspective view of the wiring component. As shown in FIGS. 6(a) to 6(c), in the two-dimensional piezoelectric actuator array (first guide frame member type) 110 of the present embodiment, wiring components 130 including substantially the same structure as that of the plurality of driving portions 31 aligned/arranged in the structural manner are preferably connected to the electrode 18 (19) of the piezoelectric device. For the wiring component 130, a plurality of electrode pins 132 individually connected to the electrodes 18 (19) of the piezoelectric device substrate housed in the first guide frame member 112 are arranged in a matrix form in one surface of a plate or block-shaped substrate 131, and are connected to an opening side corresponding to comb ribs of the housed piezoelectric device substrate in the openings of the first guide frame member 112. The connection may be carried out by soldering, bonding using a conductive adhesive, wire-bonding, or mechanical contact method. It is to be noted that the wiring component 130 may also be connected/fixed as such to the first guide frame member 112. Alternatively, after the electrode pins 132 are connected to the electrodes of the piezoelectric device substrate, the array may also be constituted such that only the substrate 131 can be removed. It is to be noted that the electrode pins 132 are preferably connected to the electrodes, while the piezoelectric device substrate is housed in the first guide frame member 112. Alternatively, the electrode pins 132 are bonded beforehand to the electrodes of each driving portion of the piezoelectric device substrate, and thereafter may be housed in the first guide frame member 112.

Furthermore, the two-dimensional piezoelectric actuator array (first guide frame member type) according to the present invention has the following preferable characteristics.

10) Highly Integrated Piezoelectric Devices

The piezoelectric device 35 constituting the two-dimensional piezoelectric actuator array (first guide frame member type) 110 shown in FIG. 4(a) includes the structure in which the electrode is formed in the film form in the outer surface of the piezoelectric member, and the piezoelectric member can be formed to be remarkably thin by the manufacturing method described later.

Moreover, for the two-dimensional piezoelectric actuator array (first guide frame member type) 110, in the piezoelectric device substrate 3 housed in the first guide frame member 112, for the plurality of driving portions 31 are integrally formed by the comb ribs of the piezoelectric device substrate 3 for the piezoelectric member portion. The piezoelectric devices 35 (driving portions 31) can be formed without being individually handled or being individually arranged. Therefore, the driving portions are arranged in the same piezoelectric device substrate 3, and the interval between the adjacent driving portions 31 is remarkably small. Furthermore, the interval (pitch) between the guide grooves 111 disposed adjacent to each other is arbitrarily set, accordingly even the deformation in the direction between the side surfaces of the driving portion 31 of the piezoelectric device 35 can be suppressed within the predetermined range, and the interval between the driving portions 31 disposed adjacent to each other in the same piezoelectric device substrate 3 may either be enlarged or reduced.

That is, the driving portion 31 itself of the piezoelectric device 35 can be formed to be remarkably thin and small. The interval between the adjacent driving portions 31 is formed to be remarkably small. Therefore, the driving portions 31 of the piezoelectric devices 35 can be disposed with the high integration which has not heretofore been achieved. In the same manner as in the one-dimensional piezoelectric actuator array 1 described in the paragraphs of "4) Driving Portion of Piezoelectric Device having High Aspect Ratio", the driving portions of the piezoelectric devices having the high aspect ratio can be arranged with the high density (see FIGS. 1(a) to 1(d)). Concretely, for the arrangement density of the driving portions 31, the ratio of the height L of the driving portion 31 to the interval between the adjacent driving portions 31 is approximately 10:1 to 1000:1. The two-dimensional piezoelectric actuator array (first guide frame member) 110 having such high integration according to the present embodiment shown in FIG. 4(a) is preferable as the actuator for use in the optical switch for the photonic router.

11) Mutually Independent Piezoelectric Devices

For the two-dimensional piezoelectric actuator array (first guide frame member type) 110, each of the plurality of driving portions 31 of the piezoelectric device substrate 3 include the piezoelectric member 4 and one pair of electrodes 18, 19. The plurality of driving portions 31 constituting the piezoelectric device 35 are arranged in the planar form (FIGS. 4(a) to 4(c)). As shown, the whole piezoelectric device substrate 3 has the comb shape, but this is the shape of the piezoelectric member 4. The common electrode 19 is formed substantially as a whole in one surface of the piezoelectric member substrate 3, and the electrodes 18 having the shapes in accordance with the individual shapes of the comb-shaped comb teeth 26 are formed in the other surface. Therefore, the driving portion 31 to which the voltage is to be applied by the electrode 18 can be selected. The individual driving portions 31 can independently be driven regardless of the driving of the adjacent driving portion 31. That is, the operation of expanding one driving portion and contracting the other driving portion is possible. When the size of the voltage to be applied to each driving portion is changed, the contraction/expansion amount can be adjusted.

12) Driving Portion of Piezoelectric Device Having High Aspect Ratio

In general, the individual piezoelectric devices constituting the piezoelectric actuator generate the displacement in accordance with the following equation.

$$X_B = \frac{L}{T} \times d_{31} \times V \qquad \text{[Equation 4]}$$

On the other hand, the stress $F_B$ is generated in accordance with the following equation.

$$F_B = W \times \frac{d_{31}}{S_{11}^E} \times V \qquad \text{[Equation 5]}$$

That is, the displacement and generation force can separately be designed. Here, T denotes the thickness of the piezoelectric member, L denotes the height, and W denotes the width.

$$S_{11}^E \qquad \text{[Equation 6]}$$

The above is the elasticity compliance. Therefore, as seen from these equations, the thickness T of the piezoelectric member is reduced and the height L is increased. This shape is advantageous for setting the displacement to be consistent with the generation force. It has heretofore been very difficult to handle the plate material which has the large aspect ratio (L/T), and it has been impossible to arrange the members with good precision.

In the two-dimensional piezoelectric actuator array (first guide frame member type) 110 according to the present invention, in the manufacturing method described later, the plurality of driving portions 31 of the piezoelectric device 35 constituting one piezoelectric device substrate 3 are not individually handled, or do not have to be individually arranged, and are easily formed integrally into the comb shape in which the flat-plate piezoelectric sheet is slit-processed (FIG. 4(c)). The piezoelectric device substrate 3 is housed/held in the first guide frame member 112. Additionally, the individual driving portions 31 are also held and positioned (FIG. 4(a)). Therefore, the aspect ratio of the driving portion 31 of the piezoelectric device 35 can be set to be high in a range of 10 to 1000. The driving portions can be constituted so as to obtain the large displacement and generation force with the low driving voltage.

13) Piezoelectric Member Superior in Straightness of Axial Line

As shown in FIG. 4, for the two-dimensional piezoelectric actuator array (first guide frame member type) 110, the straightness of the axial line with respect to the piezoelectric member 4 of the piezoelectric device 35 can be maintained to be remarkably small by the use of the first guide frame member and the manufacturing by the manufacturing method described later. That is, the piezoelectric member 4 having the elongated rectangular parallelepiped shape can maintain the shape remarkably close to the rectangular parallelepiped shape which is geometrically correct without any deformation. Therefore, it is easy to obtain the displacement and generation force in the intended direction with the intended amount. There is an advantage that the characteristics of the piezoelectric device 35 can efficiently be used. Since the straightness of the axial line is superior, the operation point at the driving time does not easily shift. The high resistance to the reaction caused by the pushing or hitting of the certain object is obtained. Even when the piezoelectric member has the high aspect ratio and the elongated shape, the damages such as breakage and crack are not easily caused.

14) Contraction/Expansion Displacement

For the two-dimensional piezoelectric actuator array (first guide frame member type), different from the conventional flexure displacement device, the electric field induced strain of the contraction/expansion of the piezoelectric member is not converted to the displacement in the flexure mode for use. The contraction/expansion of the piezoelectric member is used as such as the displacement (i.e., the height L of the piezoelectric member corresponds to that in the displacement direction at the time when the displacement is not caused) in the piezoelectric actuator. Therefore, it is easy to determine the designed value for obtaining the large displacement without lowering the generation force and response.

Next, another embodiment of the one-dimensional piezoelectric actuator array will be described concretely with reference to the drawings.

Figure 7:
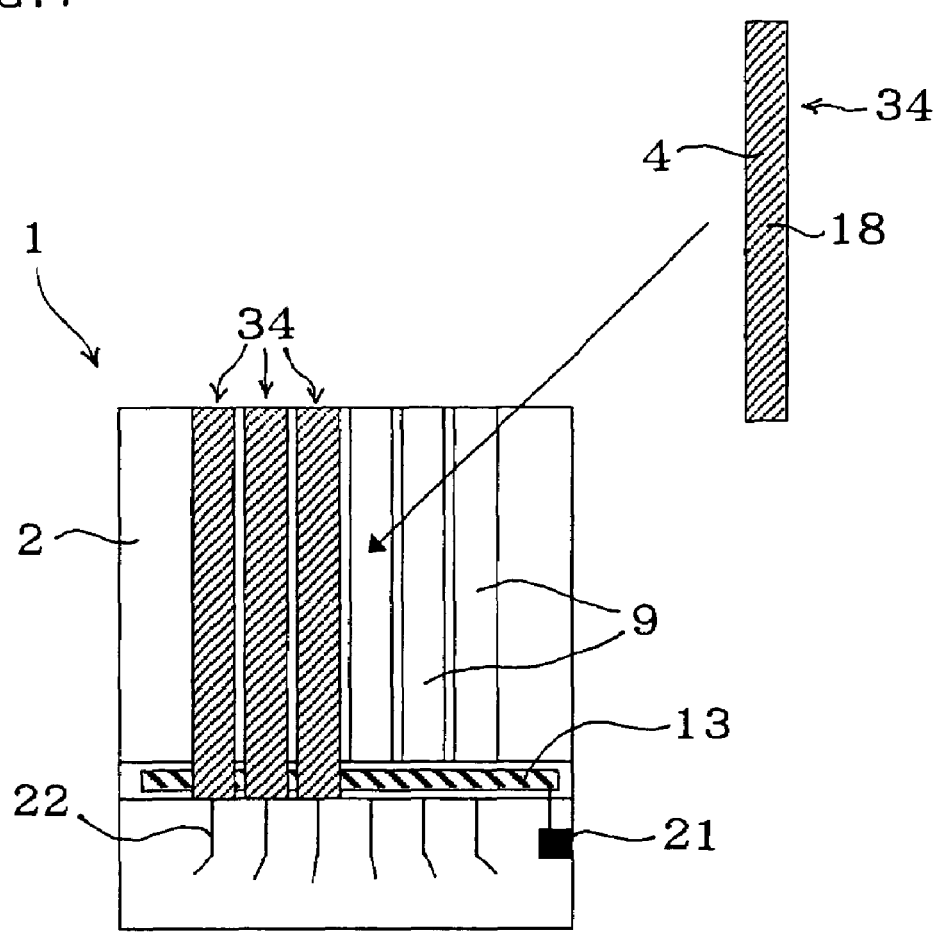
FIG. 7 is a front view showing another embodiment of the one-dimensional piezoelectric actuator array according to the present invention.

FIG. 7 is a front view showing another embodiment of the one-dimensional piezoelectric actuator array according to the present invention. The one-dimensional piezoelectric actuator array 1 of the present embodiment includes: a plurality of piezoelectric devices 34 each of which includes the plate-shaped (pillar-shaped) piezoelectric member 4 and the electrode 18 formed on the piezoelectric member 4 and which are driven based on the piezoelectric effect of the piezoelectric member 4; and the guide substrate 2 having the concave portion 9 for housing at least a part of each of the piezoelectric devices 34. The guide substrate 2 and the plurality of piezoelectric devices 34 are integrally formed so that the resultant array may be stuck in a multiply layered structural body. With this structure, the one-dimensional piezoelectric actuator array 1 of the present invention has the characteristics conforming to those described in the above 1) to 6) in the same manner as in the above-described one-dimensional piezoelectric actuator array (guide substrate type). Additionally, the following effect is produced.

That is, the one-dimensional piezoelectric actuator array 1 of the present embodiment includes the hybrid structure including the guide substrate, and therefore the guide substrate 2 protects the piezoelectric device 34, and additionally controls the deformation in the predetermined range. Even when the external force other than expected is applied to the piezoelectric device 34, the guide substrate 2 stops the deformation of the piezoelectric device 34 within the predetermined range, and accordingly the device is not easily broken. Furthermore, since the piezoelectric devices 34 are exactly positioned by the guide substrate 2, the handling properties are remarkably enhanced in this manner. Although the piezoelectric devices 34 have the high aspect ratio as shown, the possibility that the operation point at the driving time shifts or fluctuates is remarkably small.

Furthermore, since the piezoelectric devices 34 are independent of one another, the devices can independently be driven regardless of the driving of the adjacent piezoelectric device 34. That is, the operation of expanding one piezoelectric device 34 and contracting the other piezoelectric device 34 is possible. When the size of the voltage to be applied to each piezoelectric device 34 is changed, the contraction/expansion amount can be adjusted. Since the electrode terminal 21 is formed apart from the piezoelectric device 34 in the guide substrate 2, the subsequent power source connection operation is facilitated, and the yield drop caused by the manufacturing process can be prevented.

Next, the two-dimensional piezoelectric actuator array (second guide frame member) will be described concretely in terms of the characteristics with reference to the drawings.

Figure 8B:
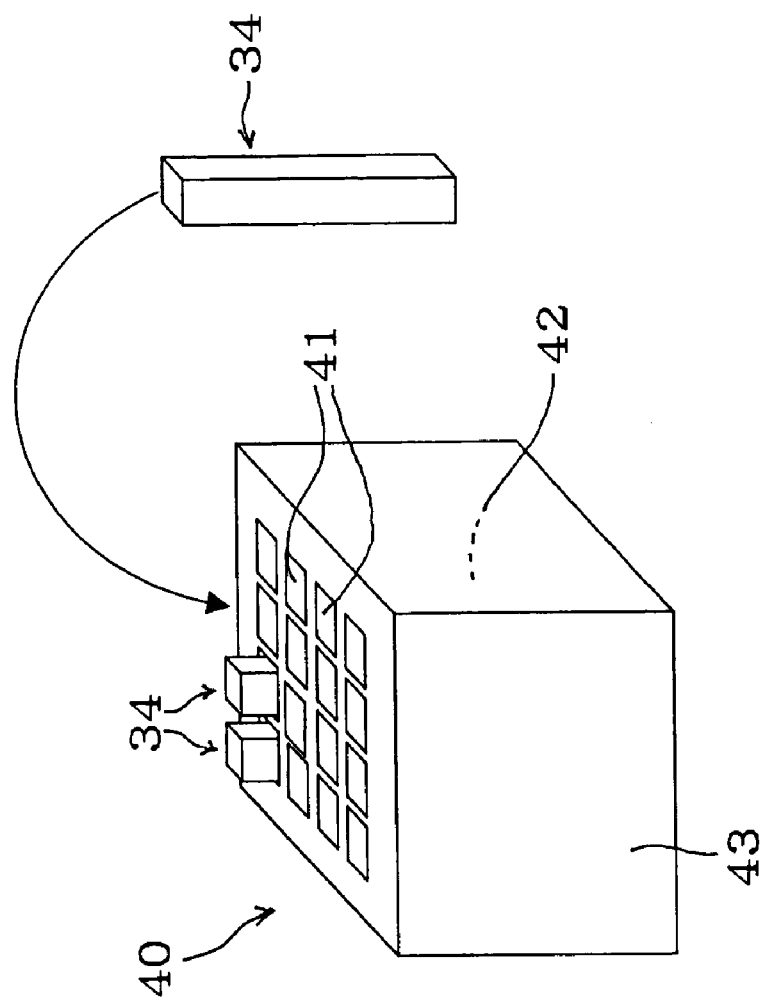
FIG. 8(b) is a perspective view showing one example of integration of the second guide frame member and piezoelectric device.
Figure 8A:
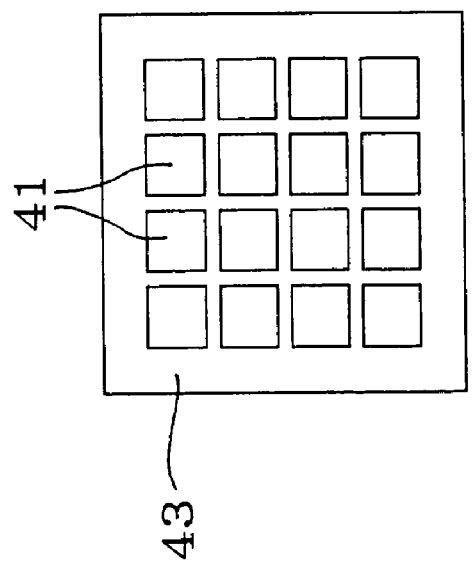
FIG. 8(a) is a top plan view of a second guide frame member.

FIGS. 8(*a*) and 8(*b*) are diagrams showing one embodiment of the two-dimensional piezoelectric actuator array (second guide frame member type) according to the present invention; FIG. 8(*a*) is a top plan view of a second guide frame member; and FIG. 8(*b*) is a perspective view showing one example of integration of the second guide frame member and piezoelectric device. A two-dimensional piezoelectric actuator array (second guide frame member type) 40 of the present embodiment includes: a plurality of piezoelectric devices 34 each of which includes a pillar-shaped piezoelectric member, and an electrode formed on the piezoelectric member and which are driven based on the piezoelectric effect of the piezoelectric member; and a second guide frame member 43 including a plurality of openings 41 arranged in a grid form, and a housing space 42 which is connected to the plurality of openings 41 and in which the plurality of piezoelectric devices 34 are positioned and housed. The respective piezoelectric devices 34 are inserted/housed via the plurality of openings 41 of the corresponding housing space 42 of the second guide frame member 43, and the plurality of piezoelectric devices 34 are spatially aligned/arranged. In this structure, the two-dimensional piezoelectric actuator array (second guide frame member type) 40 of the present embodiment has characteristics conforming to those described in 9) to 14) in the same manner as in the two-dimensional piezoelectric actuator array (first guide frame member type), and produces the following effect.

That is, the two-dimensional piezoelectric actuator array (second guide frame member type) 40 of the present embodiment includes the hybrid structure including the second guide frame member 43, and therefore the second guide frame member 43 protects the piezoelectric devices 34, and additionally inhibits the deformation in the predetermined range. Even when the external force other than expected is applied to the piezoelectric devices 34, the second guide frame member 43 stops the deformation of the piezoelectric device 34 within the predetermined range, and accordingly the device is not easily broken. Furthermore, since the piezoelectric devices 34 are exactly positioned by the second guide frame member 43, the handling properties are remarkably enhanced in this manner. Although the piezoelectric devices 34 have the high aspect ratio as shown, the possibility that the operation point at the driving time shifts or fluctuates is remarkably small.

Furthermore, since the piezoelectric devices 34 are independent of one another, the devices can independently be driven regardless of the driving of the adjacent piezoelectric device 34. That is, the operation of expanding one piezoelectric device 34 and contracting the other piezoelectric device 34 is possible. When the size of the voltage to be applied to each piezoelectric device 34 is changed, the contraction/expansion amount can be adjusted. Since the electrode terminal (not shown) is formed apart from the piezoelectric device 34 in the second guide frame member 43, the subsequent power source connection operation is facilitated, and the yield drop caused by the manufacturing process can be prevented.

Next, an application example of the piezoelectric actuator array according to the present invention will be described with reference to the drawings.

Figure 13A:
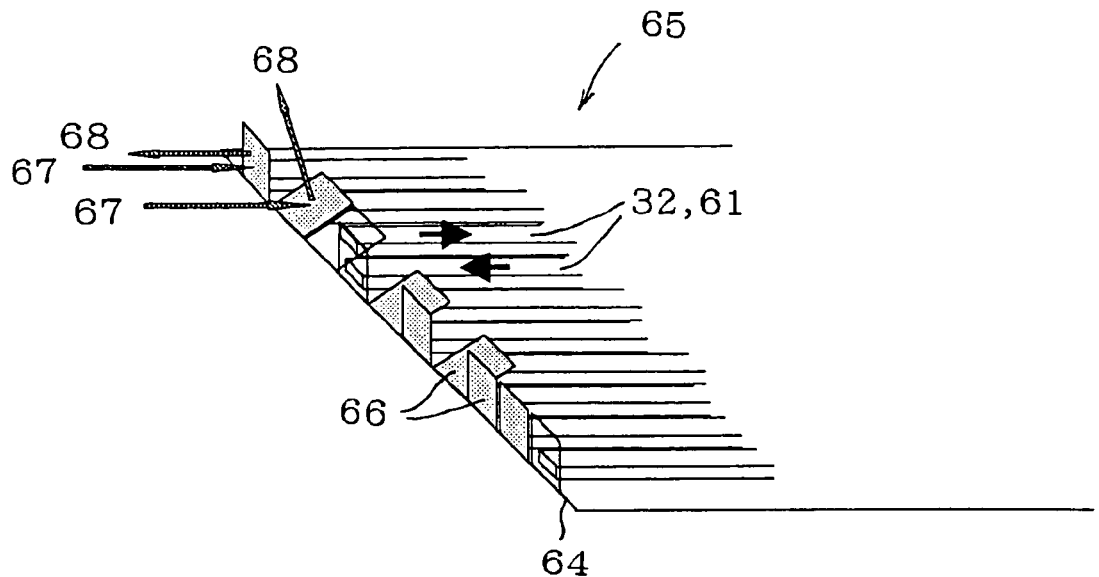
FIG. 13(a) is a perspective view schematically showing a state of operation of the micro-mirror array.
Figure 13B:
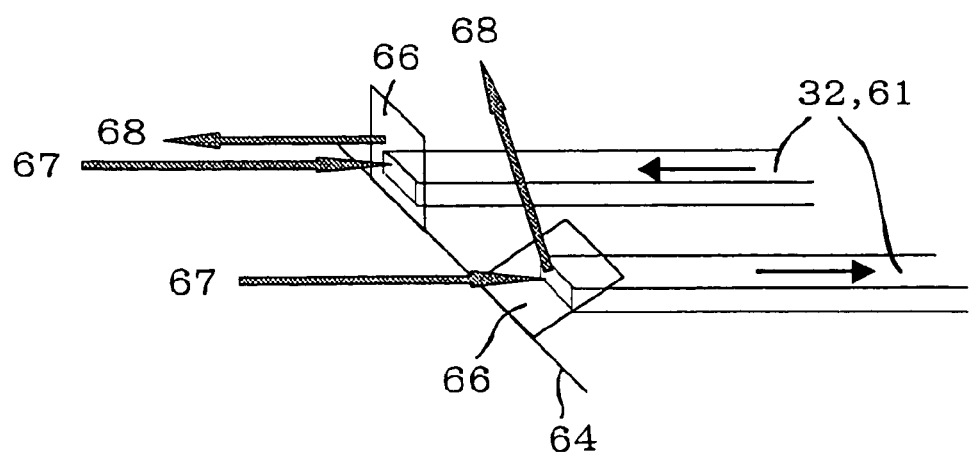
FIG. 13(b) is a partially enlarged view of FIG. 13(a)

FIGS. 13(*a*) and 13(*b*) are diagrams showing an example in which the one-dimensional piezoelectric actuator array of the present invention is applied as the actuator of a micro-mirror array; FIG. 13(*a*) is a perspective view schematically showing a state of operation of the micro-mirror array; and FIG. 13(*b*) is a partially enlarged view of FIG. 13(*a*). A micro-mirror array 65 includes micro-mirrors 66 and actuator portions 61, and the one-dimensional piezoelectric actuator array is used as the actuator portions 61 in the micro-mirror array.

In the micro-mirror array 65, the micro-mirrors 66 are arranged in a row to form pairs with a plurality of piezoelectric devices 32 of the actuator portions 61, and are rotatably disposed only in a predetermined range about a row shaft 64 which is a center axis. The surface of the micro-mirror 66 on the side opposite to the piezoelectric device 32 is constituted of a mirror surface.

For the actuator portions 61, the piezoelectric devices 32 expand/contract by the external signal, and the micro-mirror 66 is pushed/pulled and rotated only in the predetermined range, so that an inclination angle of the micro-mirror 66 can be adjusted. Through this operation, in the micro-mirror array 65, a reflection angle can be changed with respect to the light incident upon the side opposite to that of the piezoelectric device 32 (left side in the figure). For example, as shown in FIG. 13(*b*), when the micro-mirror 66 is vertically set, a reflected light 68 returns in a direction upon which an incident light 67 is incident. When the micro-mirror 66 is laid, the reflected light 68 is reflected in a direction different from the direction upon which the incident light 67 is incident, and an optical path can be changed.

In this micro-mirror array, the micro-mirror is preferably securely positioned in order to change the reflection angle of the light. A large contraction/expansion force (generation force) is required for the piezoelectric device 32, but the one-dimensional piezoelectric actuator array according to the present invention can sufficiently meet this requirement. In an electrostatic actuator according to conventional silicon micro-machining, a driving force is small, the size or weight of the micro-mirror to be driven is limited, and therefore the micro-mirror needs to be thinned. As a result, the micro-mirror warps and sometimes causes problems such as deterioration of the quality of a reflected beam. On the other hand, for the one-dimensional piezoelectric actuator array according to the present invention, the driving force which can be generated is much larger. Therefore, the micro-mirror having a large weight (high rigidity) can be driven, and the quality of the reflected light is prevented from being deteriorated.

It is to be noted that as an operation mode of the micro-mirror array, in addition to a system of rotating the micro-mirror 66 to change the angle as shown in FIGS. 13(*a*), 13(*b*), a method of fixing of the micro-mirror and piezoelectric device to realize translational movements of the respective micro-mirrors in the displacement direction of the piezoelectric device is also possible.

Figure 14:
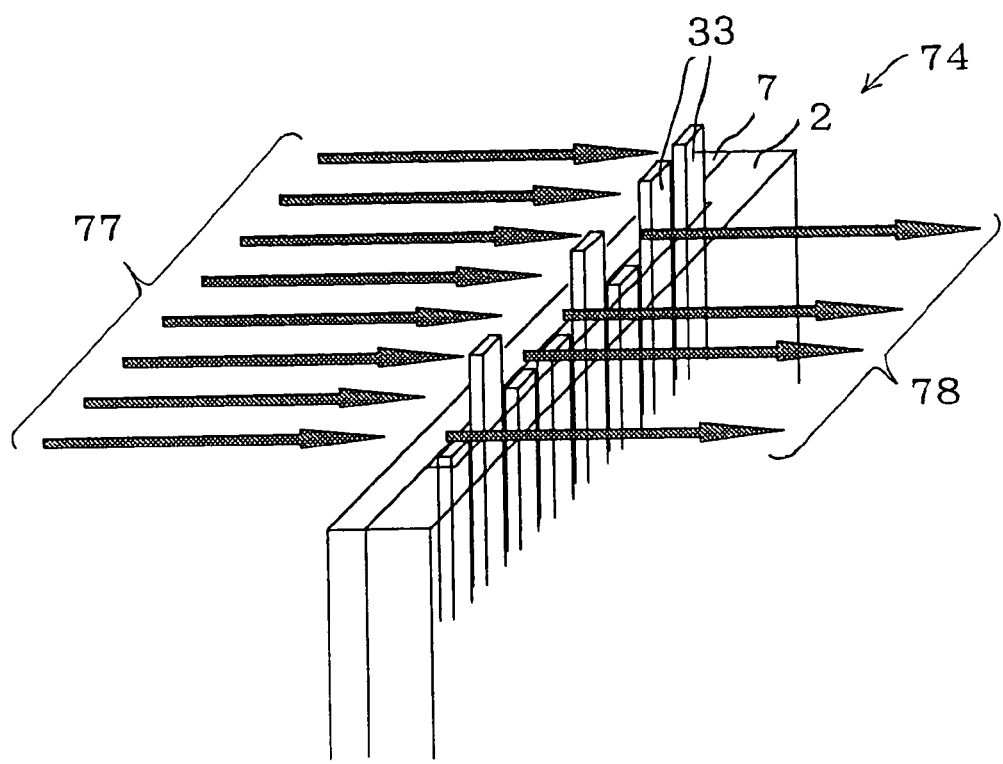
FIG. 14 is a diagram showing an example in which the one-dimensional piezoelectric actuator array according to the present invention is applied as an optical shutter, and is a perspective view schematically showing the state of the operation of the optical shutter.

FIG. 14 is a diagram showing an example in which the one-dimensional piezoelectric actuator array according to the present invention is applied as an optical shutter as such without any accessory components. In an optical shutter 74, piezoelectric devices 33 are used as shutters. The piezoelectric device 33 can be turned ON/OFF (expanded or contracted) to interrupt or pass the light incident from one direction. As shown, where the piezoelectric device 33 is expanded, an incident light 77 is cut off. Where the piezoelectric device 33 is contracted, the incident light 77 passes as a reflected light 78.

In this optical shutter, to securely interrupt or pass the light, the contraction/expansion amount (displacement) of the piezoelectric device 33 needs to be large, but the one-dimensional piezoelectric actuator array according to the present invention can sufficient meet this requirement. It is to be noted that a normal state is assumed to be a state in which the piezoelectric device 33 is expanded (to cut off the light), and the device is turned ON (voltage application) and contracted (to pass the light). Conversely, the normal state is assumed to be the state in which the piezoelectric device 33 is contracted (to pass the light), and the device is turned ON (voltage application) and expanded (to cut off the light). Either way can freely be constituted and may be used.

Even in an optical switch 200 described above with reference to FIGS. 20(a), 20(b), instead of the shown actuator section 211, the one-dimensional piezoelectric actuator array according to the present invention can be used as the actuator section.

Figure 20A:
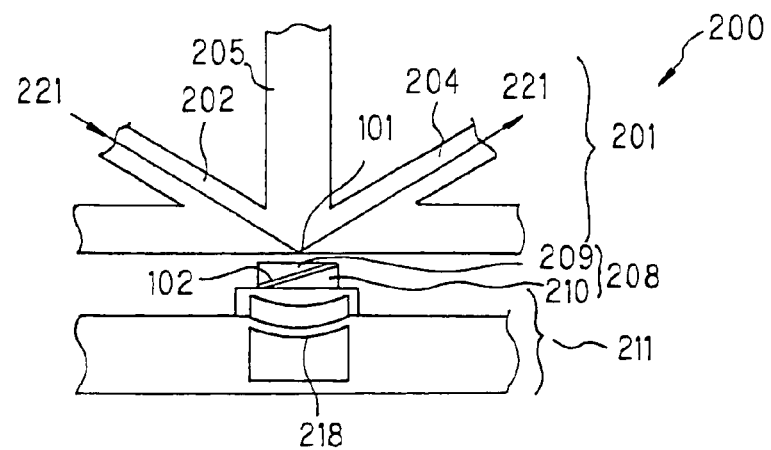
FIG. 20(a) shows an actuator section operation state in the optical switch in the application example.
Figure 20B:
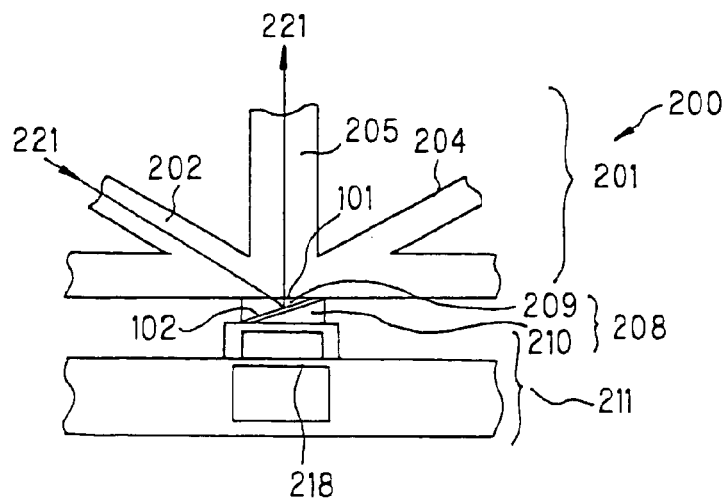
FIG. 20(b) shows an inoperative state of the actuator section in the optical switch which is the application example.

The optical switch 200 shown in FIGS. 20(a), 20(b) includes a light transmission portion 201, optical path-changing portion 208, and actuator section 211. The light transmission portion 201 includes a light reflection surface 101 disposed in a part of the surface disposed opposite to the optical path-changing portion 208, and light transmission channels 202, 204, 205 disposed in three directions from the light reflection surface 101 which is a start point. The optical path-changing portion 208 is movably disposed in the vicinity of the light reflection surface 101 of the light transmission portion 201, and includes a light introduction 209 formed of a translucent material, and a light reflection member 210 for totally reflecting the light. Furthermore, the actuator section 211 includes a mechanism which is displaced by the external signal and which transmits the displacement to the optical path-changing portion 208. By the operation of the actuator section 211, the optical path-changing portion 208 is allowed to contact or detached from the light reflection surface 101 of the light transmission portion 201. A light 221 inputted in the light transmission channel 202 is totally reflected by the light reflection surface 101 of the light transmission portion 201, and is transmitted to the specific light transmission channel 204 on the output side. On the other hand, the light is taken out into the light introduction member 209, totally reflected by the reflective surface 102 of the light reflection member 210, and can be transmitted to the specific light transmission channel 205 on the output side. In this optical switch 200, instead of the actuator section 211 which generates the flexure displacement, the one-dimensional piezoelectric actuator array according to the present invention is used in the actuator section, and accordingly there can be provided an optical switch having high contrast and low loss.

Subsequently, another embodiment of the optical switch will be described in which the two-dimensional piezoelectric actuator array (guide substrate type) according to the present invention is applied as the actuator section.

Figure 15:
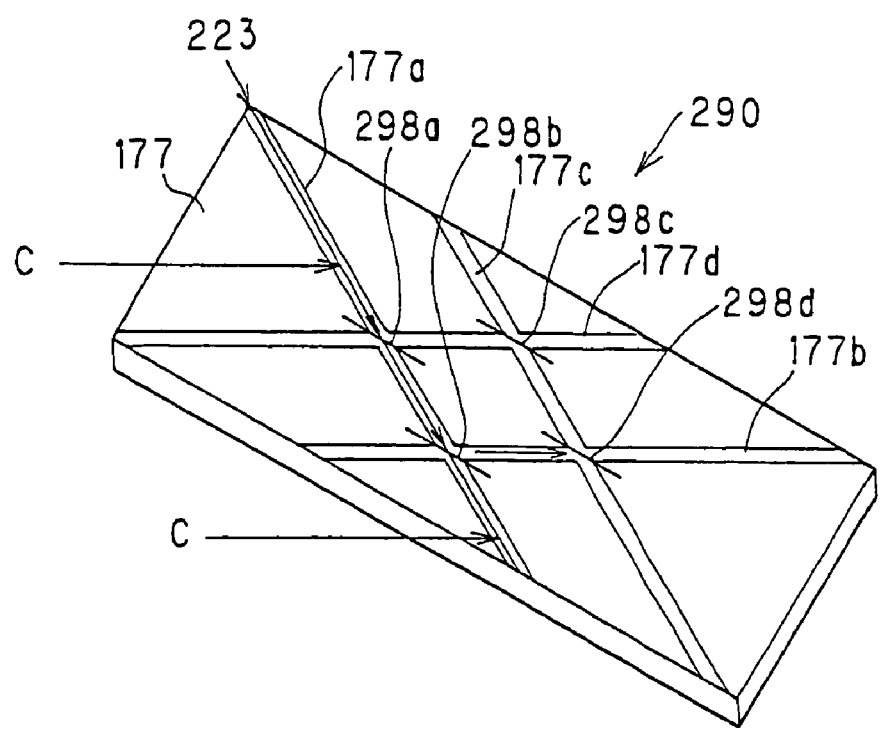
FIG. 15 is a perspective view showing one embodiment of an optical switch in an application example of the two-dimensional piezoelectric actuator array according to the present invention.

An optical switch 290 shown in FIG. 15 was published in the Proceedings of the 2001 Institute of Electronics, Information and Communication Engineers, Electronics Society Conference p. 182. In the optical switch 290, optical waveguide core portions 177a to 177d are formed in a optical waveguide member 177 so as to intersect with one another, and cuts are formed in light path-changing portions 298a to 298d which are intersection portions.

The optical switch 290 is a matrix switch which uses the operation of the driving mechanism including the actuator section to deform the cuts. Accordingly, optically discontinuous portions are formed, and the transmission path of the light inputted in any of the optical waveguide core portions 177a to 177d can be changed in the light path-changing portions 298a to 298d. It is to be noted that FIG. 15 shows that the transmission path of a light 223 inputted into the optical waveguide core portion 177a is changed to the optical waveguide core portion 177b in the light path-changing portion 298b.

In the optical switch 290, in order to reduce crosstalk, it is important to more largely open the cuts of the light path-changing portions 298a to 298d. For this, large displacement is required for the actuator section (driving mechanism).

Moreover, it is important for the light path-changing portions 298a to 298d to be capable of satisfactorily reproducing an optically discontinuous state and continuous state. For this, a material having a relatively high Young's modulus is preferably used as the material of the optical waveguide member 177 so that restoring operation of the cuts of the light path-changing portions 298a to 298d is advantageously carried out. Therefore, a large generation force is required for the actuator section in order to distort the material having the high Young's modulus.

Furthermore, the optical waveguide core portions 177a to 177d are usually by a photolithography method in which patterns can be formed with high precision and integration, and therefore the actuator section requires high positional accuracy and high densification.

For the two-dimensional piezoelectric actuator array according to the present invention (guide substrate type, first guide frame member type, and second guide frame member type), the electric field induced strain of the piezoelectric member is directly used, and the generation force is therefore large. It is also easy to set the (driving portion of) the piezoelectric device to the high aspect ratio, and the generated displacement can therefore be large. Instead of attaching/forming each driving portion of the piezoelectric device, the piezoelectric device (piezoelectric device substrate) is held and positioned by the guide substrate or the first/second guide frame member. Therefore, the dimensional deviation or inclination of the piezoelectric device itself is small, the deviation from the intended operation point at the driving time is small, and additionally a high-density constitution can also easily be realized. Therefore, the two-dimensional piezoelectric actuator array according to the present invention (guide substrate type, first guide frame member type, and second guide frame member type) is preferable as the actuator section of the optical switch 290.

Figure 16:
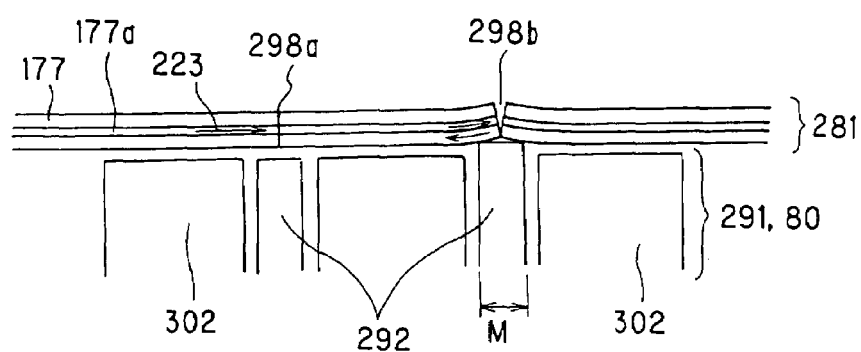
FIG. 16 is a sectional view showing one embodiment of the optical switch in the application example of the two-dimensional piezoelectric actuator array (guide substrate type) according to the present invention, and is a diagram showing a CC section of the optical switch shown in FIG. 15.

FIG. 16 shows a CC section of the optical switch 290 shown in FIG. 15, and is a sectional view showing a light transmission portion 281 including the optical waveguide core portion 177a, and an actuator section 291 including piezoelectric devices 292. As the actuator section 291, for example, the two-dimensional piezoelectric actuator array (guide substrate type) 80 shown in FIG. 2(a) is used, and disposed in accordance with the light path-changing portions 298a to 298d (cuts).

In the state shown in FIG. 16, for the optical switch 290, the piezoelectric devices 292 of the actuator section 291 in the light path-changing portion 298a is in the inoperative state, and there is no operation with respect to the optical waveguide core portion 177a. Therefore, the cut of the light path-changing portion 298a is closed, and the optical waveguide core portion 177a maintains the optically continuous state. At this time, the introduced light 223 advances straight through the light path-changing portion 298a.

The piezoelectric device 292 of the actuator section 291 in the light path-changing portion 298b is in the operative state, the displacement and stress are exerted onto the optical waveguide core portion 177a, and the cut of the light path-changing portion 298b is opened. That is, in the light path-changing portion 298b, the optical waveguide core portion 177a optically becomes discontinuous, and the introduced light 223 is totally reflected by the light path-changing portion 298b and transmitted to the optical waveguide core portion 177b.

The operative or inoperative state of the actuator section (piezoelectric device) and the presence/absence of the operation with respect to the optical waveguide core portion 177 may, needless to say, be reverse to the above-described. That is, there is no operation in the operative state of the actuator section (state of the light path-changing portion 298a in FIG. 16). On the other hand, the inoperative state may indicate the presence of the operation (state of the light path-changing portion 298b in FIG. 16). The thickness M (shown in FIG. 16) of the piezoelectric device (driving portion) imparting the function to the light path-changing portion is preferably smaller in a range in which there is no trouble in the open/close operation of the cut of the light path-changing portion, because the displacement required for the driving portion of the piezoelectric device is also small. It is to be noted that for the mode of the function into the light path-changing portion, the tip end of the driving portion may directly be brought in contact with the light path-changing portion. However, for example, an appropriate component may be added to the tip end of the driving portion, and the light path-changing portion can be operated via this component. In this case, the mode of the component is not limited to the shape of the piezoelectric device, and may be designed so that the open/close operation of the cut of the light path-changing portion is most efficiently carried out.

Figure 17:
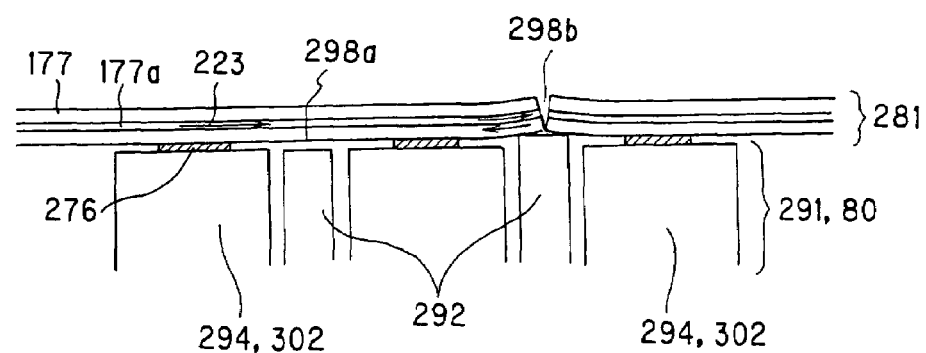
FIG. 17 is a sectional view showing another embodiment of the optical switch in the application example of the two-dimensional piezoelectric actuator array (guide substrate type) according to the present invention.

FIG. 17 shows an optical switch having substantially the same mode as that of the example shown in FIG. 16. When a guide substrate 302 is used as an optical waveguide support portion 294, it is possible to reduce the displacement necessary for opening/closing the cuts of the light path-changing portions 298a to 298d. That is, when the optical waveguide support portion 294 is disposed/fixed into the light transmission portion 281 via an optical waveguide fixing portion 276 (bonded to the optical waveguide member 177), curvature radii for opening the cuts of the light path-changing portions 298a to 298d are reduced. Therefore, even when the displacement of the piezoelectric device 292 of the actuator section 291 is small, it is possible to open the cut. Furthermore, by this advantage, a margin is produced in the open operation of the cut. Therefore, the leak or loss of the signal in the switching is more preferably reduced.

Figure 18:
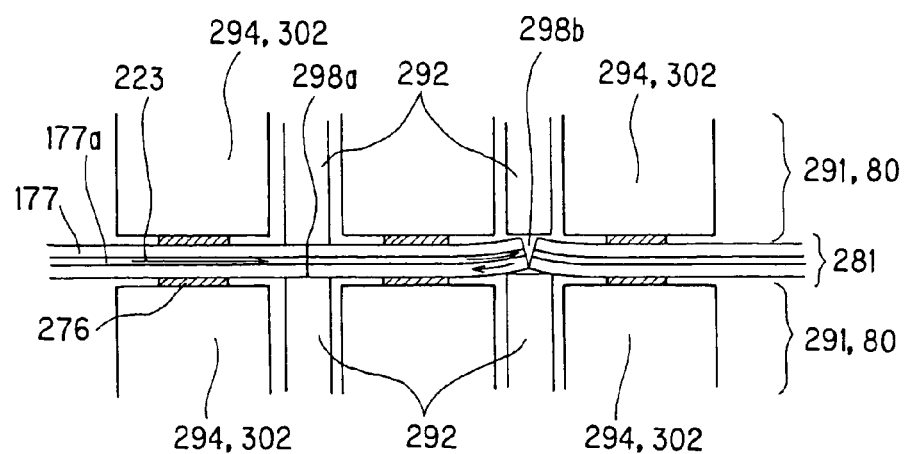
FIG. 18 is a sectional view showing still another embodiment of the optical switch in the application example of the two-dimensional piezoelectric actuator array (guide substrate type) according to the present invention.

FIG. 18 shows an example in which the actuator sections are disposed in the opposite surfaces (upper and lower) of the optical waveguide member. The mode of the two-dimensional piezoelectric actuator array applicable to the actuator section 291 is not limited as long as the two-dimensional piezoelectric actuator array (guide substrate type) according to the present invention is used. For example, the two-dimensional piezoelectric actuator array (guide substrate type) 80 can preferably be used. When the actuator sections 291 are disposed in the upper and lower surfaces of the optical waveguide member 177, closing precision of the cut of the light path-changing portion 298b can be enhanced. Additionally, a response speed in the switching can be enhanced.

When the actuator section 291 is disposed only in one surface of the optical waveguide member 177 shown in FIGS. 16 and 17, a state change to the closing from the opening of the cuts of the light path-changing portions 298a, 298b follows an elastic restoring force of the material for use in the optical waveguide member 177. When a soft material is used in the optical waveguide member 177, a relatively long time is required for this restoration (the above-described state change). This influences a time until the next switch operation, and therefore faster restoration is more preferable. The restoration means the return to the optically continuous state. By the material deterioration, especially in the operation for a long time, restoration precision drops, and the leak or loss of the signal is possibly increased.

However, when the actuator sections are disposed in the opposite surfaces of the optical waveguide member as shown in FIG. 18, the cut of the light path-changing portion 298b is forcibly held by the functions of the piezoelectric devices 292 of the actuator sections 291 disposed in both upper and lower directions with respect to the cut of the light path-changing portion, and this problem can be solved. That is, when the optical waveguide member 177 is pushed from the opposite surfaces, the closing accuracy can be held, and the state change to the closing from the opening can be realized by the response speed of the actuator section 291 (piezoelectric device 292). Therefore, the constitution in which the actuator sections are disposed in the opposite surfaces of the optical waveguide member is advantageous for realizing the switch having low loss, low leak, and high speed.

Figure 19:
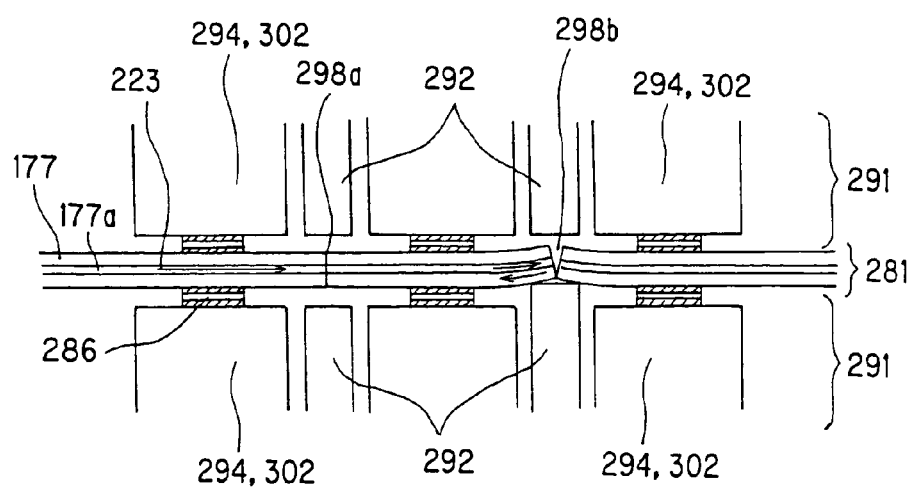
FIG. 19 is a sectional view showing still another embodiment of the optical switch in the application example of the two-dimensional piezoelectric actuator array (guide substrate type) according to the present invention.

The optical switch shown in FIG. 19 is substantially the same as that of the example shown in FIG. 18. However, this example is different in that the actuator sections 291 are bonded to the optical waveguide member 177 via optical waveguide fixing plates 286 having a higher rigidity disposed between the guide substrates 302 and the optical waveguide member 177. According to this structure, the flatness of the optical waveguide core portion 177a is enhanced, the interval between the upper surface (function surface) of the piezoelectric device 292 of the actuator section 291 and the optical waveguide member 177 can be held with high precision, and the precision of the switch operation can be enhanced.

In addition to the concrete examples of the optical system, the piezoelectric actuator array of the present invention can be used in various apparatuses which uses the function based on the displacement and vibration to mix, stir, and react liquid with liquid, liquid with solid, liquid with gas in a ultra-micro area with a micro amount. Moreover, the array can also be used as a pressure sensor which senses the stress from the outside.

Next, a manufacturing method of the piezoelectric actuator array according to the present invention will be described. First, the manufacturing method of the one-dimensional piezoelectric actuator array will be described.

The manufacturing method of the one-dimensional piezoelectric actuator array according to the present invention includes: a first step of forming a piezoelectric material in a sheet shape to prepare a piezoelectric sheet; a second step (electrode forming step) of forming the electrode in at least one surface of the piezoelectric sheet; a third step (comb shape processing step) of forming the piezoelectric sheet as a whole in a planar comb shape in which comb teeth are connected to one another in one end to prepare a piezoelectric device substrate in which comb-teeth portions constitute a plurality of driving portions; a fourth step of preparing a guide substrate having a concave portion for housing at least a part of the piezoelectric device substrate in a predetermined position in a unified form; and a fifth step (housing step) of housing the piezoelectric device substrate in the guide substrate to prepare the one-dimensional piezoelectric actuator array in which the plurality of driving portions constituting the piezoelectric device substrate are aligned/arranged in the planar manner.

To prepare the array following the above-described first to fifth steps in this order as such is a preferable mode of the manufacturing method of the one-dimensional piezoelectric actuator array according to the present invention, but the order is not limited. The order can appropriately be replaced, or it is possible to simultaneously carry out the steps. For example, the piezoelectric sheet in the first step can be prepared by sintering a ceramic green sheet containing the piezoelectric material as a major component. However, instead of the order in which the sintering is followed by the forming of the electrode and further the comb shape processing, an order in which first after forming the electrode in the ceramic green sheet, the sheet is sintered and subsequently processed in the comb shape may also be used. Alternatively, an order in which after the comb shape is processed, the sheet is sintered, and the electrode is next formed may be carried out. These three steps (sintering, electrode forming, and comb shape processing) can have six ways of orders in total. Instead of carrying out the housing step after the comb shape processing step, it is also possible to carry out the comb shape processing after the housing step. When the steps are replaced in this manner, a member to be treated according to each step accordingly naturally changes in some case. For example, when the housing step is carried out finally, an object (member to be treated) to be housed in the guide substrate in the housing step is the piezoelectric device substrate formed in the comb shape. However, when the comb shape processing is finally carried out, the housing step is carried out before. In this case, the object to be housed in the guide substrate is the piezoelectric sheet not subjected to the comb shape processing.

According to the manufacturing method, in the piezoelectric device substrate formed in the comb shape, the comb-teeth portions constitute a plurality of driving portions substantially having pillar shapes, and the plurality of driving portions are disposed in the sheet form (plane). It is to be noted that in the manufacturing method of the one-dimensional piezoelectric actuator array according to the present invention, various machine processing methods can be used in forming (processing) the piezoelectric sheet into the comb shape. Examples of the method include a dicing saw processing method, wire saw processing method, punch processing method using a metal mold, laser processing method, ion milling processing method, etching method, water jet processing method, ultrasonic processing method, slicing processing method, inner peripheral blade processing method, and the like. Among these processing methods, when the piezoelectric sheet is processed by the punch processing method using the metal mold, it is preferable to sinter the sheet after subjecting the ceramic green sheet to the punch processing. When the piezoelectric sheet is processed in the comb shape, each piezoelectric sheet may be processed. However, it is more preferable to stick multiply a plurality of piezoelectric sheets and process the sheets altogether.

One example of the steps of the manufacturing method of the one-dimensional piezoelectric actuator array according to the present invention is schematically shown in FIGS. 9(a) to 9(e). This example will be described hereinafter.

First, the ceramic green sheet (hereinafter referred to simply as the sheet) is prepared from a material containing as a major component a piezoelectric material described later. The ceramic green sheet can be prepared by a ceramic manufacturing method which has heretofore been known. For example, piezoelectric material powder described later is prepared, and a binder, solvent, dispersant, plasticizer, and the like are blended in a desired composition to prepare a slurry. After a defoaming treatment, the ceramic green sheet can be formed by sheet forming methods such as a doctor blade method and reverse roll coater method.

In FIG. 9(a), the piezoelectric device substrate 3 and guide substrate 2 are prepared. The piezoelectric device substrate 3 is prepared following the first to third steps, but as shown, for the electrode 18 in one surface of the piezoelectric device substrate 3, the electrode formed in the whole surface of the piezoelectric sheet by the third step is subjected to groove processing, insulating portions 17 are formed, and it is essential to form independent electrodes by the respective comb teeth of the comb-shaped piezoelectric device substrate. It is to be noted that the electrode in the other surface of the piezoelectric device substrate 3 remains to be formed as a whole in the other surface. When the guide substrate 2 is formed, as shown in the fourth step, the concave portion 9 slightly larger than the outer shape of the piezoelectric device substrate 3 is formed for so as to make it enable to house at least a part of the piezoelectric device substrate 3 in the predetermined position in a unified form. It is to be noted that in the piezoelectric device substrate 3, it is preferable to form the wiring circuit including the electrode terminals 20, 21 and wiring 22 for connecting the electrodes 18, 19 of the piezoelectric device substrate 3 to the external power source.

Examples of the method of forming the electrode in the piezoelectric sheet include sputtering, vacuum deposition, CVD, plating, coat, spray, and screen print methods.

Next, as shown in FIG. 9(b), an adhesive portion 13 of the guide substrate 2 is coated with the adhesive. The adhesive portion 13 abuts on the portion including the comb rib 27 (see FIG. 9(a)) of the piezoelectric device substrate 3 at a time when the piezoelectric device substrate 3 is inserted in the guide substrate 2. Subsequently, as shown in FIG. 9(c), the piezoelectric device substrate 3 is inserted/fitted in the guide substrate 2, bonded/fixed, and housed. Subsequently, as shown in FIG. 9(d), a lid plate 107 is attached so as to cover at least the driving portion 31 (portion including the comb teeth 26), and the one-dimensional piezoelectric actuator array according to the present invention is obtained. As shown, in the one-dimensional piezoelectric actuator array, the whole surface of the guide substrate 2 does not have to be covered with the lid plate 107. It is to be noted that FIG. 9(e) is a plan view of the obtained one-dimensional piezoelectric actuator array. The piezoelectric sheet can be prepared by the method (green sheet method) of sintering the ceramic green sheet as described above. However, besides the green sheet method, for example, a molded material obtained by a powder press method, injection mold method, or cast mold method can be sintered to prepare the sheet.

Next, the manufacturing method of the one-dimensional piezoelectric actuator array according to the embodiment shown in FIG. 7 will be described. The one-dimensional piezoelectric actuator array 1 shown in FIG. 7 can also be manufactured by the method conforming to the above-described manufacturing method. That is, the piezoelectric sheet is formed/processed in a so-called short strip shape, and accordingly the plurality of piezoelectric devices 34 are prepared and successively housed in the guide substrate 2. It is then possible to prepare the one-dimensional piezoelectric actuator array in which the plurality of piezoelectric devices 34 are aligned/arranged in the planar form. It is to be noted that it is possible to use the same materials as those described later in the materials constituting the members such as the piezoelectric member, electrode, and guide substrate.

Next, the manufacturing method of the two-dimensional piezoelectric actuator array (guide substrate type) will be described.

The manufacturing method of the two-dimensional piezoelectric actuator array (guide substrate type) according to the present invention includes: a step A of forming a piezoelectric material in a sheet shape to prepare a piezoelectric sheet; a step B (electrode forming step) of forming the electrode in at least one surface of the piezoelectric sheet; a step C (comb shape processing step) of forming the piezoelectric sheet as a whole in a planar comb shape in which comb teeth are connected to one another in one end to prepare a plurality of piezoelectric device substrates in which comb-teeth portions constitute a plurality of driving portions; a step D of preparing a guide substrate having a concave portion for housing at least a part of the piezoelectric device substrate in a predetermined position in a unified form; a step E (housing step) of housing the piezoelectric device substrate in the guide substrate to prepare the one-dimensional piezoelectric actuator array; and a step F (multiply sticking step) of sticking multiply a plurality of one-dimensional piezoelectric actuator arrays to prepare the two-dimensional piezoelectric actuator array in which the plurality of driving portions constituting the piezoelectric device substrate are structurally aligned/arranged.

In other words, in the manufacturing method of the two-dimensional piezoelectric actuator array (guide substrate type), a plurality of one-dimensional piezoelectric actuator arrays are prepared by the manufacturing method of the one-dimensional piezoelectric actuator array described above according to the present invention. These plurality of one-dimensional piezoelectric actuator arrays are mutually positioned and stuck.

To prepare the array following the above-described steps A to F in this order as such is the preferable mode of the manufacturing method of the two-dimensional piezoelectric actuator array (guide substrate type) according to the present invention, but the order is not limited. The order can appropriately be replaced, or it is possible to simultaneously carry out the steps. For example, the piezoelectric sheet in the step A can be prepared by sintering the ceramic green sheet containing the piezoelectric material as the major component. However, with respect to these three steps (sintering, electrode forming, and comb shape processing) in which the sintering is followed by the forming of the electrode and further the comb shape forming, there can be six ways of orders in total in conformity with the manufacturing method of the one-dimensional piezoelectric actuator array. When one one-dimensional piezoelectric actuator array (substrate unit) is prepared, instead of carrying out the housing step after the comb shape processing, it is also possible to carry out the comb shape processing after the housing step. When the steps are replaced in this manner, the member to be treated according to each step accordingly naturally changes in the same manner as in the manufacturing method of the one-dimensional piezoelectric actuator array.

According to the manufacturing method, in the piezoelectric device substrate formed in the comb shape, the comb-teeth portions constitute a plurality of driving portions substantially having the pillar shapes, the plurality of piezoelectric device substrates are stuck via the guide substrates, and accordingly the plurality of driving portions are structurally aligned/arranged.

It is to be noted that in the manufacturing method of the two-dimensional piezoelectric actuator array (guide substrate type) according to the present invention, positioning means including a positioning function in hierarchically laminating the plurality of one-dimensional piezoelectric actuator arrays is formed in the guide substrate, and the piezoelectric device substrate is housed in the guide substrate to prepare the one-dimensional piezoelectric actuator array. The function of the positioning means is used to stick multiply the plurality of one-dimensional piezoelectric actuator arrays, and the two-dimensional piezoelectric actuator array is prepared in which the plurality of driving portions constituting the piezoelectric device substrate are structurally aligned/arranged. This is preferable because the plurality of one-dimensional piezoelectric actuator arrays can simply and more accurately be positioned. This positioning means is not limited as long as the means may stick multiply the plurality of one-dimensional piezoelectric actuator arrays (substrate units). Examples of this means include a method of passing one guide pin through a through hole disposed in the guide substrate of each substrate unit, and a method of using a marker to position the arrays.

Figure 10A:
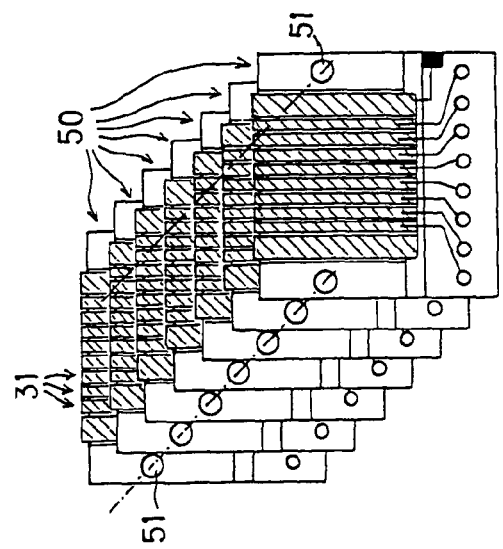
FIGS. 10(a) to 10(c) are explanatory views showing one example of the manufacturing method of the two-dimensional piezoelectric actuator array (guide substrate type) according to the present invention.
Figure 10B:
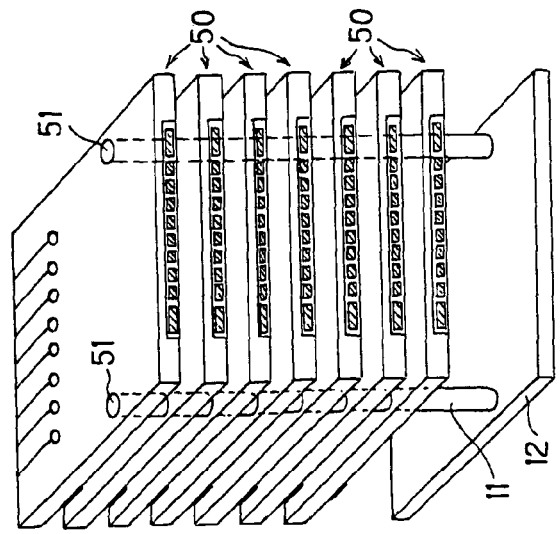
Figure 10C:
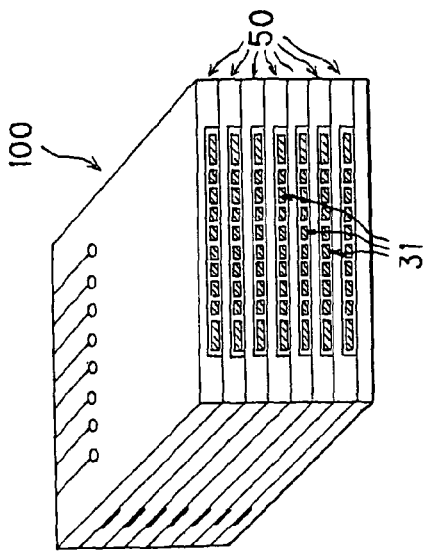

One example of the steps of the manufacturing method of the two-dimensional piezoelectric actuator array (guide substrate type) according to the present invention is schematically shown in FIGS. 10(a) to 10(c). This example will be described hereinafter.

First, the predetermined number of one-dimensional piezoelectric actuator arrays are obtained by the above-described manufacturing method of the one-dimensional piezoelectric actuator array. Subsequently, guide holes 51 are formed in the respective obtained one-dimensional piezoelectric actuator arrays as shown in FIG. 10(a) to obtain the predetermined number of substrate units 50.

Next, as shown in FIG. 10(b), a base 12 on which guide pins 11 each having a diameter slightly smaller than that of the guide hole 51 is prepared, the guide holes 51 of the substrate unit 50 are engaged with the guide pins 11, and all the substrate units 50 are successively stick multiply on the base 12 to obtain a two-dimensional piezoelectric actuator array (guide substrate type) 100 shown in FIG. 10(c). It is to be noted that the substrate units 50 are coated with the adhesive before multiply sticking, and can be bonded/fixed simultaneously with multiply sticking. Besides the method using the adhesive, methods easy in attachment/detachment can be used such as a method of fastening the multiply stuck one-dimensional piezoelectric actuator arrays with bolts/nuts.

The guide pin 11 preferably has an outer diameter of about 0.1 to 10 mm. The guide hole 51 preferably has an inner diameter of about 100.1 to 110% of the outer diameter of the guide pin 11. When the diameter is smaller than 100.1%, it is sometimes practically difficult to insert the guide pin 11 in the guide hole 51. When the diameter is larger than 110%, the positioning accuracy of the driving portion 31 of the piezoelectric device drops, and it becomes necessary to also use another alignment means. The shape of the guide hole 51 is preferably circular, but appropriate geometric shapes can also be used such as quadrangular, triangular, and cross shapes.

Next, the manufacturing method of the two-dimensional piezoelectric actuator array (first guide frame member) will be described.

The manufacturing method of the two-dimensional piezoelectric actuator array (first guide frame member type) according to the present invention includes: a step 1 of forming a piezoelectric material into a sheet form to prepare a piezoelectric sheet; a step 2 (electrode forming step) of forming the electrode in at least one surface of the piezoelectric sheet; a step 3 (comb shape processing step) of forming the piezoelectric sheet as a whole in a planar comb shape in which comb teeth are connected to one another in one end to prepare a piezoelectric device substrate in which comb-teeth portions constitute a plurality of driving portions; a step 4 of preparing a first guide frame member having a hollow box shape and including a plurality of pairs of housing guide grooves in two inner surfaces facing each other, in which the plurality of piezoelectric device substrates are housed in an aligned state in predetermined positions at predetermined intervals and which are arranged at an interval corresponding to a thickness of the piezoelectric device substrate in accordance with the number of piezoelectric device substrates; and a step 5 (housing step) of housing the plurality of piezoelectric device substrates in the housing guide grooves of the first guide frame member to prepare the two-dimensional piezoelectric actuator array in which the plurality of driving portions constituting the piezoelectric device substrate are structurally aligned/arranged.

In other words, in the manufacturing method of the two-dimensional piezoelectric actuator array (first guide frame member type), the piezoelectric device substrate is prepared by the first to third steps (comb shape processing step) in the above-described one-dimensional piezoelectric actuator array according to the present invention. The first guide frame member having the predetermined shape is prepared and the respective piezoelectric device substrates are positioned while inserted/housed in the first guide frame member.

To prepare the array following the above-described steps 1 to 6 in this order as such is the preferable mode of the manufacturing method of the two-dimensional piezoelectric actuator array (first guide frame member) according to the present invention, but the order is not limited. The order can appropriately be replaced, or it is possible to simultaneously carry out the steps. For example, the piezoelectric sheet in the step 1 can be prepared by sintering the ceramic green sheet containing the piezoelectric material which is the major component. However, with respect to these three steps (sintering, electrode forming, and comb shape processing) in which the sintering is followed by the forming of the electrode and further the comb shape forming, there can be six ways of orders in total in conformity with the manufacturing method of the one-dimensional piezoelectric actuator array. When the steps are replaced, the member to be treated according to each step accordingly naturally changes in the same manner as in the manufacturing method of the one-dimensional piezoelectric actuator array. According to the manufacturing method, in the piezoelectric device substrate formed in the comb shape, the comb-teeth portions constitute the plurality of driving portions having substantially the pillar shapes, the plurality of piezoelectric device substrates are inserted/housed in the first guide frame member, and therefore the plurality of driving portions are structurally aligned/arranged.

Figure 11:
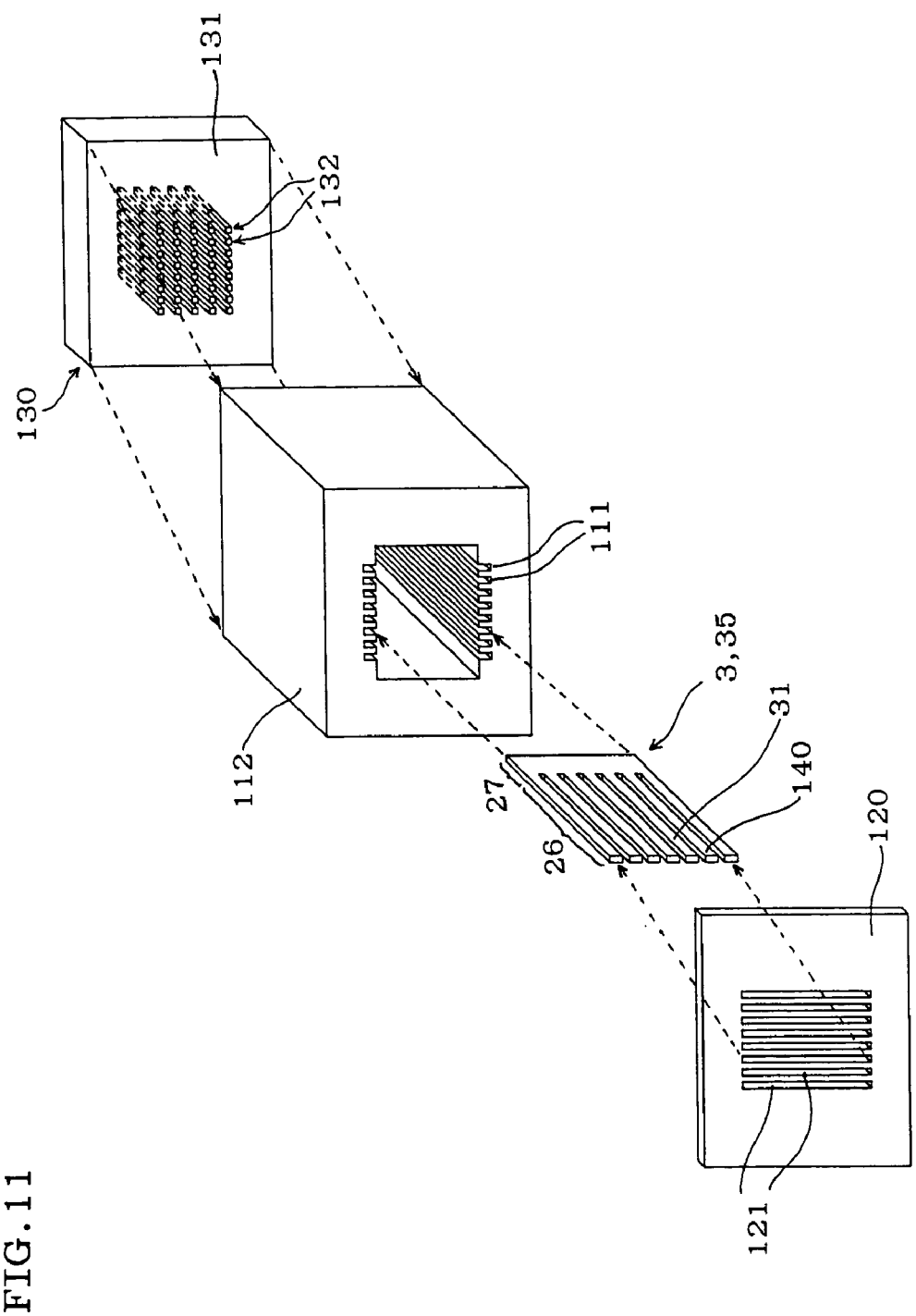
FIG. 11 is an explanatory view showing one example of the manufacturing method of the two-dimensional piezoelectric actuator array (first guide frame member type) according to the present invention.

One example of the steps of the manufacturing method of the two-dimensional piezoelectric actuator array (first guide frame member type) according to the present invention is schematically shown in FIG. 11. This example will be described hereinafter.

First, up to the third step (comb shape processing step) of the manufacturing method of the one-dimensional piezoelectric actuator array, the predetermined number of piezoelectric device substrates 3 are obtained. A plurality of pairs of guide grooves 111 for positioning and holding the piezoelectric device substrates at predetermined intervals are formed in the inner surfaces of the first guide frame member 112 disposed opposite to each other. The number of formed guide grooves 111 may appropriately be set in accordance with the number of piezoelectric device substrates 3 housed in the first guide frame member 112. It is to be noted that instead of forming the guide grooves 111 in the predetermined places of the first guide frame member 112, the first guide frame member 112 in which the guide grooves 111 are formed beforehand may integrally be formed.

Next, when the respective piezoelectric device substrates 3 are inserted/housed in the respective guide grooves 111 of the first guide frame member 112 as shown in FIG. 11, the two-dimensional piezoelectric actuator array (first guide frame member type) 110 can be manufactured in which the plurality of driving portions 31 are structurally aligned/arranged independently of one another. It is to be noted that a lid member 120 in which slits 121 are formed may also be used to position tip ends 140 of the driving portions 31. Concretely, the tip ends 140 of the driving portions 31 are inserted in the slits 121 to position the tip ends 140. The slits 121 are formed at substantially the same interval as that of the guide grooves 111 disposed adjacent to each other in the lid member 120, and have the shapes corresponding to those of the tip ends 140 of the driving portions 31.

Moreover, as shown in FIG. 11, the wiring component 130 constituted of the electrode pins 132 arranged in the matrix form in one surface of the substrate 131 having the predetermined shape may be attached from a side opposite to the comb ribs 27 of the piezoelectric device substrates 3 housed in the first guide frame member 112 so as to connect the pins to the electrodes formed in the driving portions 31 of the piezoelectric device substrates 3. The electrode pins 132 are aligned/arranged three-dimensionally in substantially the same manner as the plurality of driving portions 31, and are individually connected to the electrodes formed in the driving portions 31.

Next, the manufacturing method of the two-dimensional piezoelectric actuator array (second guide frame member) of the embodiment shown in FIGS. 8(*a*), 8(*b*) will be described. The two-dimensional piezoelectric actuator array (second guide frame member type) 40 shown in FIGS. 8(*a*), 8(*b*) can also be manufactured by a method which conforms to the above-described manufacturing method. That is, the piezoelectric sheet is formed/processed in the so-called pillar shape (plate shape), and accordingly the plurality of piezoelectric devices 34 are prepared and successively housed in the second guide frame member 43 via the openings 41. It is then possible to prepare the two-dimensional piezoelectric actuator array (second guide frame member type) 40 in which the plurality of piezoelectric devices 34 are spatially aligned/arranged. It is to be noted that it is possible to use the same materials as those described later in the materials constituting the members such as the piezoelectric member, electrode, and (second) guide frame member.

According to the manufacturing method of the piezoelectric actuator array according to the present invention described above, the shape of the piezoelectric device is substantially determined by the processed shape of the piezoelectric sheet. When the length of the comb tooth of the comb-shaped piezoelectric sheet is only increased, it is possible to form the piezoelectric device including the driving portion having the high-aspect-ratio shape with high accuracy, and the piezoelectric device having the large displacement can easily be obtained. The thickness of the piezoelectric sheet can arbitrarily be selected, but the actuator characteristics such as the mechanical strength of the piezoelectric device, the relation of the displacement with a driving voltage, and the response speed can be adjusted in accordance with the thickness of the sheet if necessary. The processed section is substantially constituted of straight lines, and the comb-teeth portions have high-accuracy plate or pillar shapes. As a result, the straightness of the axial line of the piezoelectric member of the piezoelectric device can be maintained to be remarkably small.

Moreover, when a longitudinal piezoelectric effect is used, the piezoelectric device substrate 3 shown in FIGS. 12(a) to 12(c) may be used. That is, the piezoelectric device substrate 3 shown in FIGS. 12(a) to 12(c) includes a structure in which the piezoelectric members 4 and inner electrodes 28, 29 formed on the piezoelectric member are alternately stuck in the drawing direction of the comb teeth, and the inner electrodes 28, 29 are alternately exposed every other layer in the opposite surfaces of the piezoelectric device substrate 3. Individual electrode patterns 38 are formed with respect to the respective driving portions 31 in one surface of the piezoelectric device substrate 3, and a common electrode pattern 39 is formed with respect to the respective driving portions 31 in the other surface. This structure in which the inner electrodes 28, 29 are exposed in the opposite surfaces of the piezoelectric device substrate 3 means that the inner electrodes 28, 29 can electrically be connected to the external electrodes (not shown). Therefore, in addition to the structure, for example, shown in FIGS. 12(a) to 12(c), the piezoelectric device substrate for use in the piezoelectric actuator array of the present invention may include a structure in which all the inner electrodes are exposed to the opposite surfaces of the piezoelectric device substrate, and are subjected to an insulating treatment in the drawing direction of the comb teeth every predetermined time (every other layer).

With respect to the piezoelectric actuator arrays and manufacturing methods according to the present invention, the embodiments have been described above, but the present invention is not limited to the above-described modes as described above. For example, in addition to the embodiment in which the electrodes are formed in the opposite surfaces of the piezoelectric member (sheet) of a single plate, an embodiment is also possible in which each electrode layer is formed between each pair of piezoelectric members (sheets) and the members are stuck or bonded. When the total thickness of the plurality of piezoelectric sheets is set to be equal to that of the constitution of the single plate, as compared with the actuator device by one pair of electrodes and the single plate of the piezoelectric sheet, the same displacement can be obtained with a lower driving voltage without deteriorating the mechanical strength. In other words, the mechanical strength and generation force can be increased without sacrificing the displacement. Furthermore, it is possible to use the mode in which the piezoelectric device using the longitudinal piezoelectric effect is disposed. In this case, the piezoelectric member and electrode are alternately stuck, for example, in the displacement direction in the piezoelectric device substrate.

Subsequently, the materials for use in the piezoelectric actuator array of the present invention will be described hereinafter.

First, the material of the piezoelectric member (sheet) which is the driving portion, that is, the piezoelectric material will be described. The type of the piezoelectric material is not limited as long as the electric field induced strains such as the piezoelectric and electrostrictive effects are caused by the material. The material may be crystalline or amorphous, or it is also possible to use a semiconductor ceramic, ferroelectric ceramic, or antiferroelectric ceramic. The material may appropriately be selected and used in accordance with the use. The material may or may not require the polarization treatment.

Furthermore, the materials are not limited to the ceramics, and may be piezoelectric materials of macromolecules, such as polyvinylidene fluoride (PVDF), or composite materials of these macromolecules and ceramics. Additionally, in this case, from the aspect of heat resistance of the high-polymer material, instead of sintering and forming the device, the device is subjected to a heat treatment to such a degree that the high-polymer material is thermoset, and formed.

By the use of the ceramic superior in a material strength aspect as the piezoelectric material, it is possible to more advantageously use the constitution having the high aspect ratio which is one of the characteristics of the piezoelectric actuator array according to the present invention, and the generated displacement and stress can effectively be exerted. With the constitution having the high aspect ratio, the ceramic superior in material characteristics is preferable for obtaining the piezoelectric device which can be driven at the low voltage and which has the enhanced characteristics.

Concrete examples of the ceramic material include a piezoelectric or electrostrictive ceramic containing one alone of, or a mixed or dissolved material of lead zirconate, lead titanate, lead magnesium niobate, lead nickel niobate, lead zinc niobate, lead manganese niobate, lead antimony stannate, lead manganese tungstate, lead cobalt niobate, barium titanate, sodium bismuth titanate, bismuth neodymium titanate (BNT-base), potassium sodium niobate, and strontium bismuth tantalite.

These ceramics preferably constitute the major component which occupies 50% by mass or more in the ceramic components constituting the piezoelectric member. Especially, the material preferably has a high electromechanical coupling coefficient, and a stable material composition is easily obtained through the sintering step. In these respects, the followings are preferably used: a material containing lead zirconate titanate (PZT-base) which is the major component; a material containing lead magnesium niobate (PMN-base) which is the major component; a material containing lead nickel niobate (PNN-base) which is the major component; a material containing a mixed or dissolved material of lead zirconate, lead titanate, and lead magnesium niobate, which is the major component; a material containing a mixed or dissolved material of lead zirconate, lead titanate, and lead nickel niobate, which is the major component; and a material containing sodium bismuth titanate which is the major component.

Examples of the antiferroelectric ceramic include: a ceramic containing lead zirconate which is the major component; a ceramic containing a mixed or dissolved material of lead zirconate and lead stannate, which is the major component; a ceramic which contains lead zirconate as the major component and to which lanthanum oxide is added; and a ceramic which contains a mixed or dissolved material of lead zirconate and lead stannate as the major component and to which lead niobate is added.

It is to be noted that an average particle diameter of ceramic crystal grains is preferably 0.05 to 2 µm in a design in which the mechanical strength of the piezoelectric member constituting the driving portion is regarded as most important. This is because the mechanical strength of the piezoelectric member (sheet) is enhanced. When the contraction/expansion characteristics of the piezoelectric member are regarded as most important in the design, the average particle diameter of crystal grains is preferably 1 to 7 µm. This is because high piezoelectric characteristics can be obtained.

Next, the material of the electrode is not especially regulated as long as the material is solid at room temperature. The material may be, for example, a simple metal or an alloy, and there is no problem even with a mixed material of an insulating ceramic such as zirconium oxide, hafnium oxide, titanium oxide, and cerium oxide, and the simple metal or alloy. When the material is sintered before forming the electrode, an electrode material containing high-melting point noble metals such as platinum, palladium, and rhodium, or alloys such as silver-palladium, silver-platinum, and platinum-palladium as the major component; a mixed material of platinum with a substrate material or piezoelectric material; or a cermet material is preferably used.

Moreover, when the electrode is formed after sintering the piezoelectric member, in addition to the electrode materials, aluminum, titanium, chromium, iron, cobalt, nickel, copper, zinc, niobium, molybdenum, ruthenium, silver, tin, tantalum, tungsten, gold, lead, and another simple metal or an alloy of these can also be used.

Next, the materials constituting the guide substrate and first/second guide frame member are not limited, but insulating materials are preferable. This is because the voltage is applied to the housed piezoelectric device substrate. For the material constituting the guide substrate, the friction of the guide substrate against the surface disposed opposite to the piezoelectric device substrate is preferably smaller. Therefore, a material which can reduce this friction is preferable. This is because the driving portion of the housed piezoelectric device substrate sometimes possibly contacts the guide substrate during the driving. Concrete examples of the material constituting the guide substrate and first/second guide frame member include ceramic, glass, resin, and silicon. Regardless of the material for use, the coating for reducing the friction with respect to the guide substrate, and/or the surface treatment is also preferable. Furthermore, an insulating oil or resin is preferably charged between the piezoelectric device substrate and guide substrate, or in spaces among the comb teeth so as to further enhance the friction reduction and insulation between the electrodes.

EXAMPLES

The present invention will be described hereinafter based on examples, but the present invention is not limited to these examples.

(Preparation of Piezoelectric Device Substrate)

A ceramic green sheet formed of a lead zirconate titanate-based ceramic and an organic binder was prepared using a doctor blade method. The thickness of the ceramic green sheet was set to about 200 µm. The ceramic green sheet was sintered at about 1300° C. to prepare the piezoelectric sheet having the flat plate shape. Next, film electrodes were formed as a whole in the opposite surfaces of the piezoelectric sheet. After screen-printing a gold paste, the electrodes were sintered at about 600° C. and formed. Next, this piezoelectric sheet was processed in the comb shape by the mechanical processing using a dicing saw and wire saw. For the comb shape, the pitch of the comb teeth was set to 500 µm, a comb width was 400 µm, and comb length was 15 mm. Next, groove processing was carried out among the respective comb teeth in one surface, the respective electrodes of the comb teeth were individually separated, and the piezoelectric device substrate was obtained. Accordingly, the piezoelectric device substrate was prepared in which the individual electrode was formed in one surface for each driving portion of the piezoelectric device and the electrode common to all the driving portions was formed in the other surface.

It is to be noted that as a method of forming the individual electrode for each comb tooth, in addition to the method of the groove processing of the piezoelectric sheet in which the uniform electrodes are formed, the corresponding electrode pattern may be formed beforehand in each comb-tooth portion by the printing.

(Preparation of Guide Substrate)

The guide substrate was prepared for holding and positioning the piezoelectric device substrate so that the individual electrodes and common electrode can be connected to the respective driving portions of the piezoelectric device substrate. The guide substrate in which the wiring circuit was formed was subjected to the groove processing (forming processin of concave portion for housing) by the mechanical processing such as slicing so that the piezoelectric device substrate can be inserted/engaged and housed in the guide substrate. Examples of the method of preparing the guide substrate include a method of laminating and preparing the green sheets formed of the ceramic material and punched/processed in the predetermined shapes.

(Bonding/Fixing of Piezoelectric Device Substrate)

While the piezoelectric device substrate was fitted in the concave portion for housing of the guide substrate, the comb rib portion of the piezoelectric device substrate was fixed to the guide substrate. Accordingly, the one-dimensional piezoelectric actuator array may be formed in which one end of the piezoelectric device is fixed and the other end is free. Each electrode terminal of the guide substrate can be connected to the individual electrodes and common electrode of the piezoelectric device substrate, for example, by soldering or wire-bonding. To take out the individual electrodes and common electrode of the piezoelectric device substrate from the same surface, for example, the opposite side surfaces of the piezoelectric device substrate are coated with a conductive material, and the portion of the surface which is not driven on the side of the individual electrodes of the piezoelectric device substrate is short-circuited from the side of the common electrode. The common electrode may be may be taken out from the side of the individual electrodes. As a method of fixing the piezoelectric device substrate to the guide substrate, in addition to the fixing method by adhesion using various resin-based, ceramic-based, or glass-based adhesives, examples of the method include fixing methods such as welding, press, screw, and diffusion bonding.

(Operation Confirmation of Actuator)

First, a voltage of about DC 300 V was applied between the electrodes of each driving portion constituting the piezoelectric device to carry out the polarization treatment of the piezoelectric member. Thereafter, the displacement of the driving portion was measured on measurement conditions of sinusoidal wave voltage application of 0-200 V, 1 kHz. As a result, it was confirmed that each driving portion operated with the displacement of 10.5 µm or more.

(Preparation of Two-Dimensional Piezoelectric Actuator Array (Guide Substrate Type))

16 one-dimensional piezoelectric actuator arrays each including 16 driving portions were prepared, the guide pins were passed through the guide holes disposed in the respective guide substrates to position the arrays, and the arrays were superposed and bonded. Accordingly, the two-dimensional piezoelectric actuator array (guide substrate type) was obtained in which the tip ends of the driving portions were aligned/arranged in the matrix form. With respect to all of 256 (16×16) driving portions, the operation was confirmed in the same manner as described above, and the similar result was obtained.

(Preparation of Two-Dimensional Piezoelectric Actuator Array (First Guide Frame Member Type))

In the same method as that described above (preparation of the piezoelectric device substrate), an about 150 μm thick piezoelectric sheet having the flat plate shape was prepared. Next, the film electrode was formed in one surface of the piezoelectric sheet so as to have a short trip shape having a width of 400 μm and a pitch of 500 μm. The film electrode was formed as a whole in the other surface. After screen-printing the gold paste, the electrodes were sintered at about 600° C. and formed. Next, by the mechanical processing using the dicing saw, the electrodes having the short strip shapes were halfway divided, and the comb shapes were processed such that the comb length was 20 mm and the number of combs was 32. Accordingly, the piezoelectric device substrate was prepared. It is to be noted that holding portions each having a width of about 1 mm were disposed on opposite outer sides from the opposite-end comb teeth so that the portions were to be inserted/held in the guide grooves of the first guide frame member.

The first guide frame member was prepared in which 32 pairs of guide grooves each having a width of about 160 μm, a depth of about 1 mm, and a pitch of 500 μm were formed in the inner surfaces disposed opposite to each other. In one opening of the first guide frame member, the lid member in which 32 slits were formed in a width of about 155 μm and at a pitch of 500 μm was disposed in accordance with the arrangement of the guide grooves.

The holding portions of the prepared piezoelectric device substrate were inserted in the guide grooves of the first guide frame member, and the tip ends of the piezoelectric device substrate were inserted in the slits. All the 32 piezoelectric device substrates were housed in the first guide frame member. Accordingly, the two-dimensional piezoelectric actuator array (guide frame member type) was prepared in which 1024 driving portions were aligned/arranged in the matrix form.

The wiring component in which 32×32=1024 electrode pins each having a diameter of 350 μm and a length of about 2 mm were projected and arranged at a pitch of 500 μm in the matrix form was attached to the other opening of the first guide frame member from one surface of the substrate substantially having the plate shape. The respective embodiment pins were individually connected to the respective electrodes of the piezoelectric device substrates. It is to be noted that in the connection, the tip ends of the electrode pins were coated with a conductive adhesive and bonded to the electrodes of the piezoelectric device substrates. With respect to all the 1024 (32×32) driving portions, the operation was confirmed in the same manner as described above, and the similar result was obtained.

As described above in detail, according to the present invention, there are provided a piezoelectric actuator array by which conventional problems are solved and a large displacement is obtained with a lower voltage and whose generation force is large and which includes a piezoelectric device (driving portion) having a higher aspect ratio than ever before and in which the piezoelectric devices (driving portions) can highly be integrated, and a manufacturing method of the array.

Moreover, the piezoelectric actuator array according to the present invention can preferably be applied to optical micro-devices such as an optical switch, optical shutter, and mirror array, an image display apparatus, a high-frequency filter, a micro-pump, a droplet discharge apparatus, and the like. From a viewpoint based on a piezoelectric effect, it is also possible to use the actuator array of the present invention as various sensors such as an acceleration sensor and pressure sensor.

What is claimed is:

1. A one-dimensional piezoelectric actuator array comprising:
    a piezoelectric device substrate having a plurality of comb teeth arranged in a one-dimensional matrix and connected to one another at a first end of the piezoelectric device substrate, at least one of the comb teeth being one of a plate-shaped piezoelectric member and a pillar-shaped piezoelectric member having at least one pair of electrodes formed thereon, the one-dimensional matrix forming a plane extending along a length of the comb teeth from the first end of the piezoelectric device substrate to an opposite end thereof and contacting each of the plurality of comb teeth; and
    a guide substrate having a concave portion for housing at least a part of the piezoelectric device substrate, the concave portion extending parallel to the plane of the one-dimensional matrix,
    wherein the guide substrate and the piezoelectric device substrate are integrally unified in such a manner that the guide substrate and the piezoelectric device substrate are readily usable as individual stacks for formation of a multiple stack structural body.

2. The one-dimensional piezoelectric actuator array according to claim 1,
    wherein the guide substrate includes at least one of projections and ridges arranged at an interval corresponding to a width between the piezoelectric members positioned adjacently each other in a bottom surface of the concave portion for housing, and
    wherein the respective at least one of projections and ridges are inserted between the piezoelectric members positioned adjacent to each other, and the guide substrate and the piezoelectric device substrate are integrally unified.

3. The one-dimensional piezoelectric actuator array according to claim 2 further comprising a wiring circuit disposed on the guide substrate and connected to the electrodes.

4. A two-dimensional piezoelectric actuator array comprising a plurality of one-dimensional piezoelectric actuator arrays stacked together, said one-dimensional piezoelectric actuator array comprising:
    a piezoelectric device substrate having a plurality of comb teeth arranged in a one-dimensional matrix and connected to one another at a first end of the piezoelectric device substrate, at least one of the comb teeth being one of a plate-shaped piezoelectric member and a pillar-shaped piezoelectric member having at least one pair of electrodes formed thereon, the one-dimensional matrix forming a plane extending along a length of the comb teeth from the first end of the piezoelectric device substrate to an opposite end thereof and contacting each of the plurality of comb teeth; and
    a guide substrate having a concave portion for housing at least a part of the piezoelectric device substrate, the concave portion extending parallel to the plane of the one-dimensional matrix.

5. The two-dimensional piezoelectric actuator array according to claim 4, wherein the guide substrate includes at least one of projections and ridges arranged at an interval corresponding to a width between the piezoelectric members positioned adjacently each other in a bottom surface of the concave portion for housing, and wherein the respective at least one of projections and ridges are inserted between piezoelectric members positioned adjacent to each other, and the guide substrate and the piezoelectric device substrate are integrally unified.

6. The two-dimensional piezoelectric actuator array according to claim 4 further comprising a wiring circuit disposed on the guide substrate and connected to the electrodes.

7. A two-dimensional piezoelectric actuator array comprising:

a plurality of piezoelectric device substrates, each piezoelectric device substrate having a plurality of comb teeth connected to one another at one end of the piezoelectric device substrate, at least one of the comb teeth being one of a plate-shaped piezoelectric member and a pillar-shaped piezoelectric member having at least one pair of electrodes formed thereon; and a first guide frame member being a hollow box shape and having a plurality of pairs of guide grooves for housing the plurality of piezoelectric device substrates, the guide grooves being formed on two opposed inner surfaces of the guide frame member, and the guide grooves being arranged in pairs at an interval corresponding to a thickness of the piezoelectric device substrate, wherein the plurality of piezoelectric device substrates is inserted and housed in the guide grooves of the first guide frame member such that each piezoelectric device substrate is aligned in a corresponding pair of the guide grooves, and the plurality of piezoelectric members remain movable within the guide frame member throughout a portion of the piezoelectric members having the pair of electrodes formed thereon.

8. The two-dimensional piezoelectric actuator array according to claim 7 further comprising a lid member having slits formed at the same interval as between two guide grooves positioned adjacently each other, the slits having a shape corresponding to a shape of tip ends of the piezoelectric members, wherein the tip ends of the plurality of piezoelectric members are inserted into the slits to be fixed at predetermined positions, respectively.

9. The two-dimensional piezoelectric actuator array according to claim 8 further comprising wiring components having a structure aligned/arranged in a spatial manner same as that of the plurality of piezoelectric members and being connected to respective electrodes.

10. A one-dimensional piezoelectric actuator array comprising:

a plurality of piezoelectric devices arranged in a one-dimensional matrix in an independently separated state, each of which comprises a one of a plate-shaped piezoelectric member and a pillar-shaped piezoelectric member having at least one pair of electrodes formed thereon, the one-dimensional matrix forming a plane extending along a longitudinal length of the piezoelectric devices and contacting each of the plurality of piezoelectric devices;

a guide substrate having a concave portion for housing at least a part of each of the plurality of piezoelectric devices, the concave portion extending parallel to the plane of the one-dimensional matrix wherein the guide substrate and the plurality of piezoelectric devices are integrally unified in such a manner that the guide substrate and the plurality of piezoelectric devices are readily usable as individual stacks for formation of a multiple stack structural body.

11. A two-dimensionally aligned piezoelectric actuator array comprising:

a plurality of piezoelectric devices, each piezoelectric device comprising one of a plate-shaped piezoelectric member and a pillar-shaped piezoelectric member, and at least one pair of electrodes formed on the piezoelectric member; and a second guide frame member, having a plurality of openings arranged in a grid form, and a housing space being channeled through the plurality of openings, wherein the piezoelectric devices are fixed within the second guide frame member by inserting each of the plurality of piezoelectric devices into corresponding openings of the housing space of the second guide frame member, thereby the plurality of piezoelectric devices remain movable within the second guide frame member throughout a portion of the piezoelectric devices having the pair of electrodes formed thereon.

12. The two-dimensional piezoelectric actuator array according to claim 11 further comprising wiring components having a structure aligned/arranged in a spatially manner same as that of the plurality of piezoelectric devices and being connected to respective electrodes.

* * * * *